(12) United States Patent
Kwak et al.

(10) Patent No.: US 10,497,675 B2
(45) Date of Patent: Dec. 3, 2019

(54) SEMICONDUCTOR DEVICE INCLUDING MULTIPLE SEMICONDUCTOR CHIPS

(71) Applicants: Byoung Soo Kwak, Seoul (KR); Tae Hong Min, Hwaseong-si (KR); In Young Lee, Yongin-si (KR); Tae Je Cho, Yongin-si (KR)

(72) Inventors: Byoung Soo Kwak, Seoul (KR); Tae Hong Min, Hwaseong-si (KR); In Young Lee, Yongin-si (KR); Tae Je Cho, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 49 days.

(21) Appl. No.: 15/331,801

(22) Filed: Oct. 21, 2016

(65) Prior Publication Data
US 2017/0162544 A1 Jun. 8, 2017

(30) Foreign Application Priority Data
Dec. 3, 2015 (KR) .................... 10-2015-0171791

(51) Int. Cl.
*H01L 25/065* (2006.01)
*H01L 23/498* (2006.01)
(Continued)

(52) U.S. Cl.
CPC ........ *H01L 25/0657* (2013.01); *H01L 21/563* (2013.01); *H01L 23/49827* (2013.01); *H01L 24/83* (2013.01); *H01L 25/0652* (2013.01); *H01L 25/50* (2013.01); *H01L 24/05* (2013.01); *H01L 24/06* (2013.01); *H01L 24/13* (2013.01); *H01L 24/14* (2013.01); *H01L 24/16* (2013.01); *H01L 24/17* (2013.01); *H01L 24/29* (2013.01); *H01L 24/32* (2013.01); *H01L 24/73* (2013.01); *H01L 24/92* (2013.01); *H01L 25/105* (2013.01);
(Continued)

(58) Field of Classification Search
CPC .............. H01L 25/0657; H01L 21/563; H01L 29/0657; H01L 25/50; H01L 25/0652; H01L 24/83; H01L 23/49827; H01L 2924/15151; H01L 2924/18161; H01L 2924/18301; H01L 24/32; H01L 23/28–3192
See application file for complete search history.

(56) References Cited

U.S. PATENT DOCUMENTS

| | | | | |
|---|---|---|---|---|
| 5,647,123 A * | 7/1997 | Greenwood | .......... | H01L 21/563 174/260 |
| 6,084,308 A * | 7/2000 | Kelkar | .................. | H01L 21/563 257/693 |
| 6,094,354 A * | 7/2000 | Nakajoh | ............... | H01L 21/563 174/535 |
| 7,179,683 B2 | 2/2007 | Low et al. | | |
| 7,344,969 B2 * | 3/2008 | Tan | ..................... | H01L 23/3128 257/778 |
| 7,564,140 B2 * | 7/2009 | Lee | ....................... | H01L 21/563 257/778 |

(Continued)

*Primary Examiner* — Thanh Y. Tran
(74) *Attorney, Agent, or Firm* — Renaissance IP Law Group LLP

(57) ABSTRACT

There is provided a semiconductor device, enhanced with process capability and reliability by way of flow control of an adhesive material to fix semiconductor chips. The semiconductor device includes a first semiconductor chip including a first surface and a second surface opposite to each other, a flow regulating structure formed at the first surface of the first semiconductor chip, and a second semiconductor chip mounted on the first surface of the first semiconductor chip. The second semiconductor chip overlaps at least a portion of the flow regulating structure.

14 Claims, 26 Drawing Sheets

(51) Int. Cl.
*H01L 21/56* (2006.01)
*H01L 23/00* (2006.01)
*H01L 25/00* (2006.01)
*H01L 25/10* (2006.01)

(52) U.S. Cl.
CPC ............ *H01L 2224/0401* (2013.01); *H01L 2224/0557* (2013.01); *H01L 2224/06181* (2013.01); *H01L 2224/131* (2013.01); *H01L 2224/13082* (2013.01); *H01L 2224/14181* (2013.01); *H01L 2224/16145* (2013.01); *H01L 2224/16146* (2013.01); *H01L 2224/16227* (2013.01); *H01L 2224/1703* (2013.01); *H01L 2224/17181* (2013.01); *H01L 2224/26145* (2013.01); *H01L 2224/26175* (2013.01); *H01L 2224/2919* (2013.01); *H01L 2224/32145* (2013.01); *H01L 2224/32225* (2013.01); *H01L 2224/73204* (2013.01); *H01L 2224/83385* (2013.01); *H01L 2224/92125* (2013.01); *H01L 2225/06513* (2013.01); *H01L 2225/06517* (2013.01); *H01L 2225/06527* (2013.01); *H01L 2225/06541* (2013.01); *H01L 2225/06544* (2013.01); *H01L 2225/06568* (2013.01); *H01L 2225/1023* (2013.01); *H01L 2225/1058* (2013.01); *H01L 2924/1431* (2013.01); *H01L 2924/1434* (2013.01); *H01L 2924/15311* (2013.01); *H01L 2924/15331* (2013.01)

(56) References Cited

U.S. PATENT DOCUMENTS

| | | | |
|---|---|---|---|
| 7,888,172 B2 | 2/2011 | Huang | |
| 8,415,202 B2 | 4/2013 | Ohba | |
| 8,455,301 B2 | 6/2013 | Lee et al. | |
| 8,962,481 B2 | 2/2015 | Lin et al. | |
| 8,982,577 B1* | 3/2015 | Fuentes | H01L 23/13 257/787 |
| 8,994,155 B2 | 3/2015 | Tsai et al. | |
| 9,728,479 B2* | 8/2017 | Chou | H01L 23/3157 |
| 2004/0228771 A1* | 11/2004 | Zhou | B01L 3/502715 422/503 |
| 2006/0046352 A1* | 3/2006 | Low | H01L 21/563 438/127 |
| 2006/0220259 A1* | 10/2006 | Chen | H01L 21/563 257/778 |
| 2013/0026655 A1* | 1/2013 | Lee | H01L 23/13 257/777 |
| 2014/0027867 A1* | 1/2014 | Goida | H01L 23/5389 257/416 |
| 2014/0117469 A1* | 5/2014 | Takahashi | B81C 1/0023 257/415 |
| 2014/0175681 A1 | 6/2014 | Zhang et al. | |
| 2014/0248745 A1 | 9/2014 | Wu et al. | |
| 2014/0322866 A1 | 10/2014 | Chen et al. | |
| 2014/0339708 A1* | 11/2014 | Jang | H01L 23/34 257/777 |
| 2015/0014863 A1 | 1/2015 | Shih et al. | |
| 2015/0214110 A1 | 7/2015 | Lin et al. | |

\* cited by examiner

SEMICONDUCTOR DEVICE INCLUDING MULTIPLE SEMICONDUCTOR CHIPS

CROSS-REFERENCE TO RELATED APPLICATION

This application claims priority from Korean Patent Application No. 10-2015-0171791 filed on Dec. 3, 2015 in the Korean Intellectual Property Office, and all the benefits accruing therefrom under 35 U.S.C. 119, the contents of which in its entirety are herein incorporated by reference.

BACKGROUND

1. Technical field

The present disclosure relates to a semiconductor device, and more particularly, to a semiconductor device comprising a through-silicon via (TSV).

2. Description of the Related Art

The current trends in the electronic industry are moving toward the fabrication of light-weight, small-sized, fast-speed, multi-functional, and high-performance products. To this end, the multi-chip stacked package technology or the system-in-package (SIP) technology is being actively developed. The multi-chip stacked package technology or the SIP technology may employ a TSV.

As several semiconductor chips are used in a semiconductor package, ways to efficiently fill the materials for use in fixing respective semiconductor chips between the respective semiconductor chips are studied.

SUMMARY

The present disclosure provides a semiconductor device, enhanced with process capability and reliability by way of flow control of adhesive material to fix semiconductor chips.

According to an aspect of the present inventive concept, there is provided a semiconductor device comprising a first semiconductor chip including a first surface and a second surface opposite to each other; a first uneven pattern formed at the first surface of the first semiconductor chip; and a second semiconductor chip on the first surface of the first semiconductor chip, where the second semiconductor chip overlaps at least a portion of the first uneven pattern in a vertical direction.

According to another aspect of the present inventive concept, there is provided a semiconductor device comprising a first semiconductor chip including a first through-silicon via, and a first surface and a second surface opposite each other; a first uneven pattern formed at the first surface of the first semiconductor chip; a second semiconductor chip on the first surface of the first semiconductor chip, where the second semiconductor chip overlaps at least a portion of the first uneven pattern in a vertical direction and includes a third surface and a fourth surface opposite each other, wherein the second semiconductor chip includes a second through-silicon via, and the third surface faces the first surface; and a third semiconductor chip on the fourth surface of the second semiconductor chip, which does not includes a through-silicon via and connected with the second semiconductor chip.

According to still another aspect of the present inventive concept, there is provided a semiconductor device comprising a first semiconductor chip including a through-silicon via, and a through-silicon via pad connected with the through-silicon via, the through-silicon via being formed on a first surface of the first semiconductor chip; a connection terminal on a second surface opposite the first surface of the first semiconductor chip, which is connected with the first semiconductor chip; a second semiconductor chip on the first surface of the first semiconductor chip, which is connected with the first semiconductor chip; a fixing film on the first surface of the first semiconductor chip, which fills between the first semiconductor chip and the second semiconductor chip and is formed along a perimeter of the second semiconductor chip; and a radial trench at the first surface of the first semiconductor chip, which is formed within the first semiconductor chip and extends from a center region of the first surface of the first semiconductor chip toward a corner of the first surface of the first semiconductor chip.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
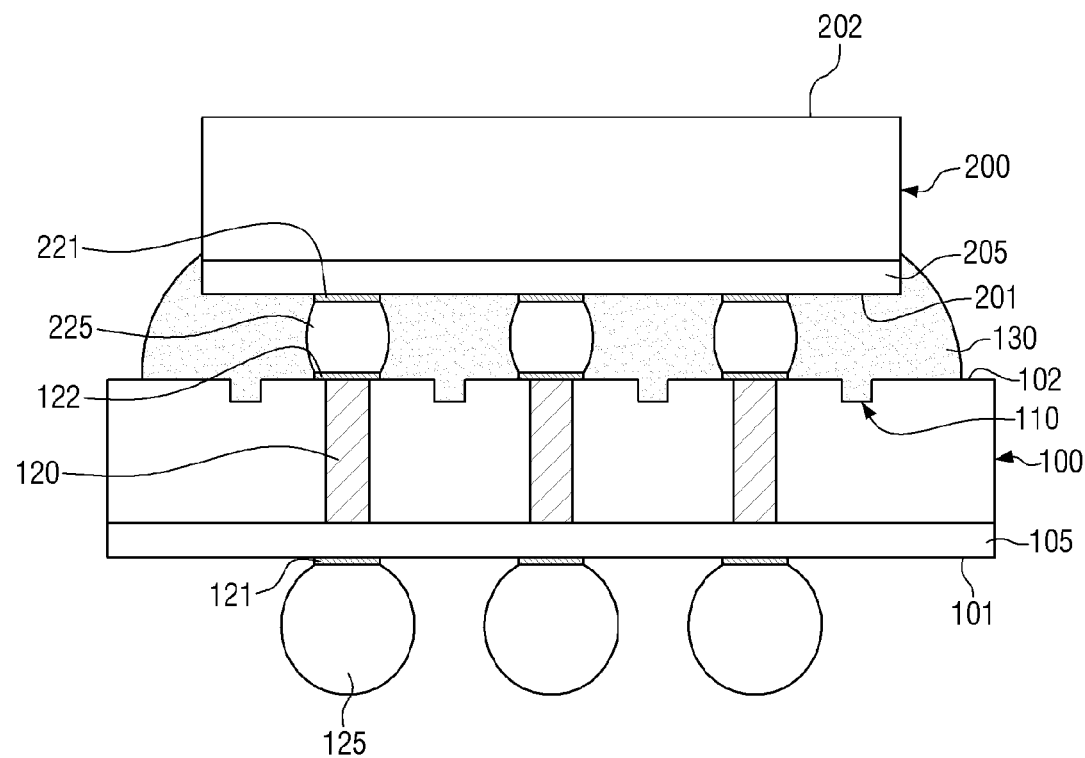
FIG. 1 is a view illustrating a semiconductor device according to some exemplary embodiments.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinbelow, a semiconductor device according to some exemplary embodiments will be explained with reference to FIGS. 1 to 3.

Figure 2A:
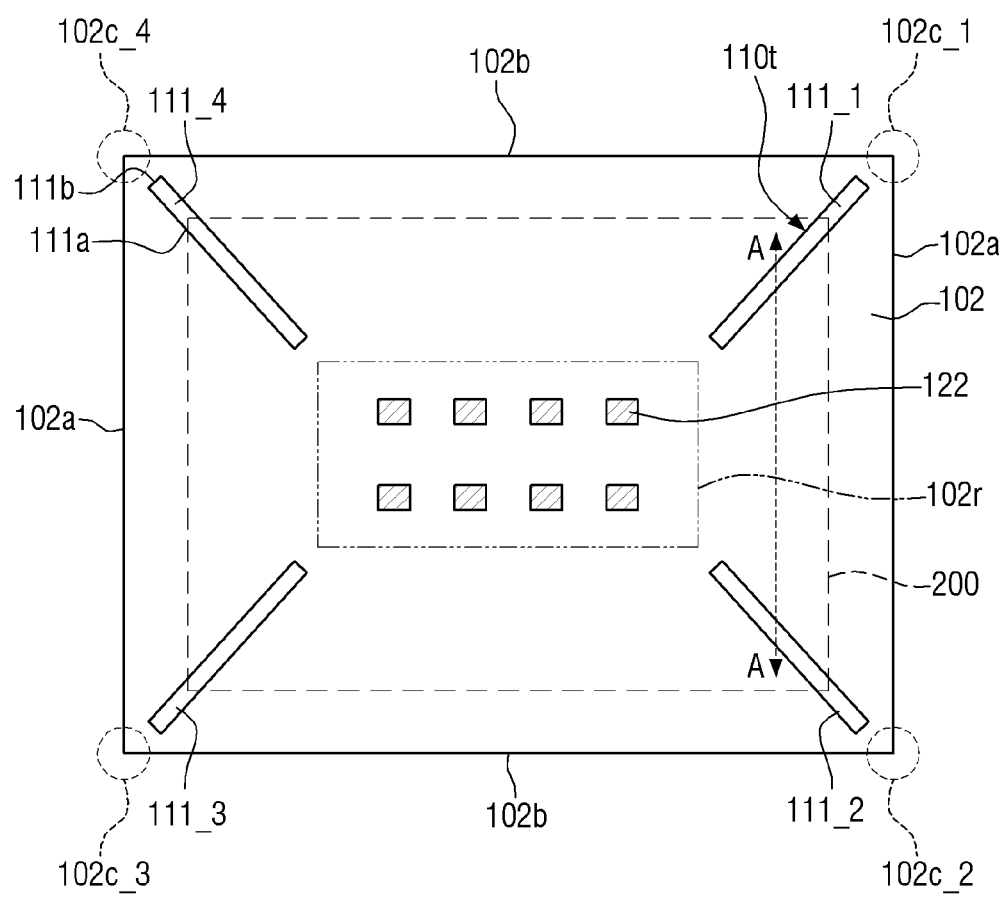
FIG. 2A is a plan view illustrating a first uneven pattern formed on a second surface of a first semiconductor chip of FIG. 1 according to some embodiments.

FIG. 1 is a cross-sectional view illustrating a semiconductor device according to some exemplary embodiments. FIG. 2A is a plan view illustrating a first uneven pattern or a flow regulating structure formed on a second surface of a first semiconductor chip of FIG. 1. FIG. 3 is a cross-sectional view of the semiconductor device taken along line A-A of FIG. 2A.

Figure 2B:
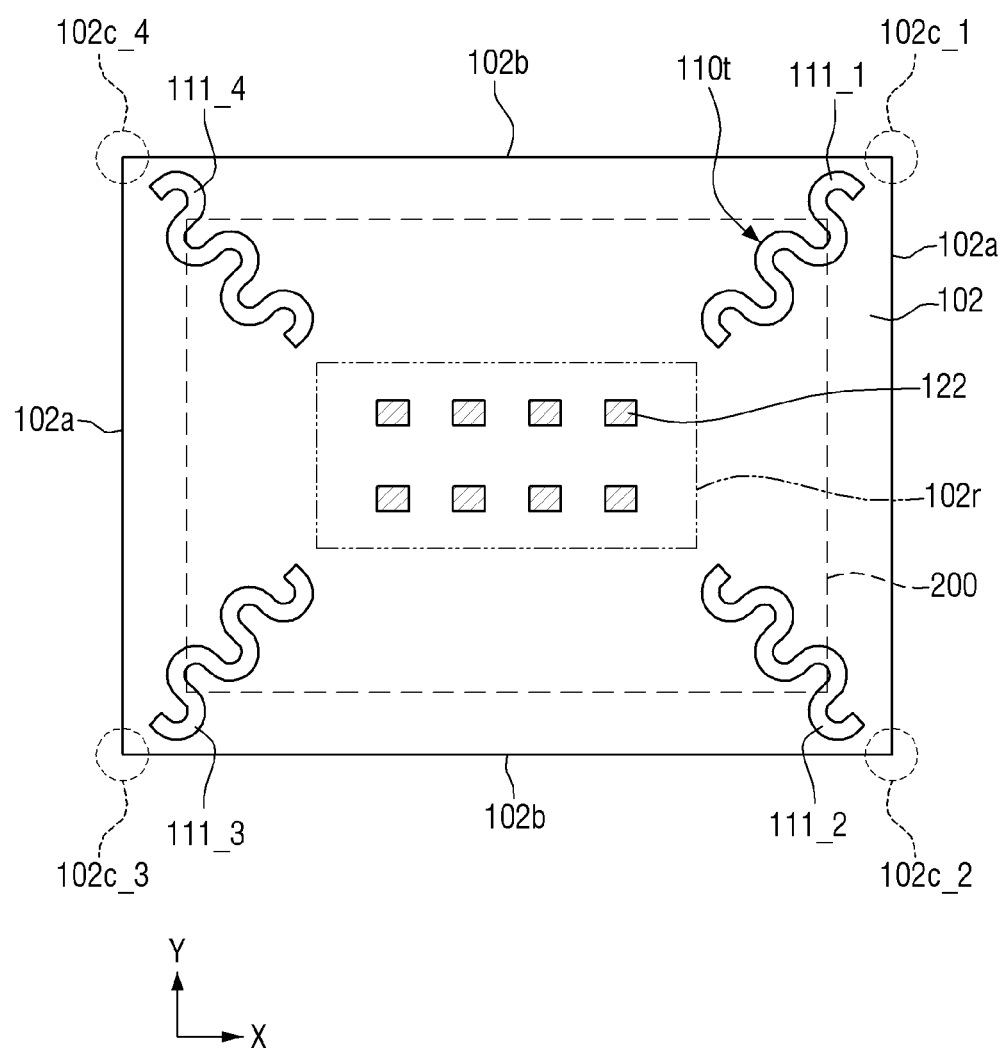
FIG. 2B is a plan view illustrating a first uneven pattern formed on a second surface of a first semiconductor chip of FIG. 1 according to some embodiments.
Figure 3:
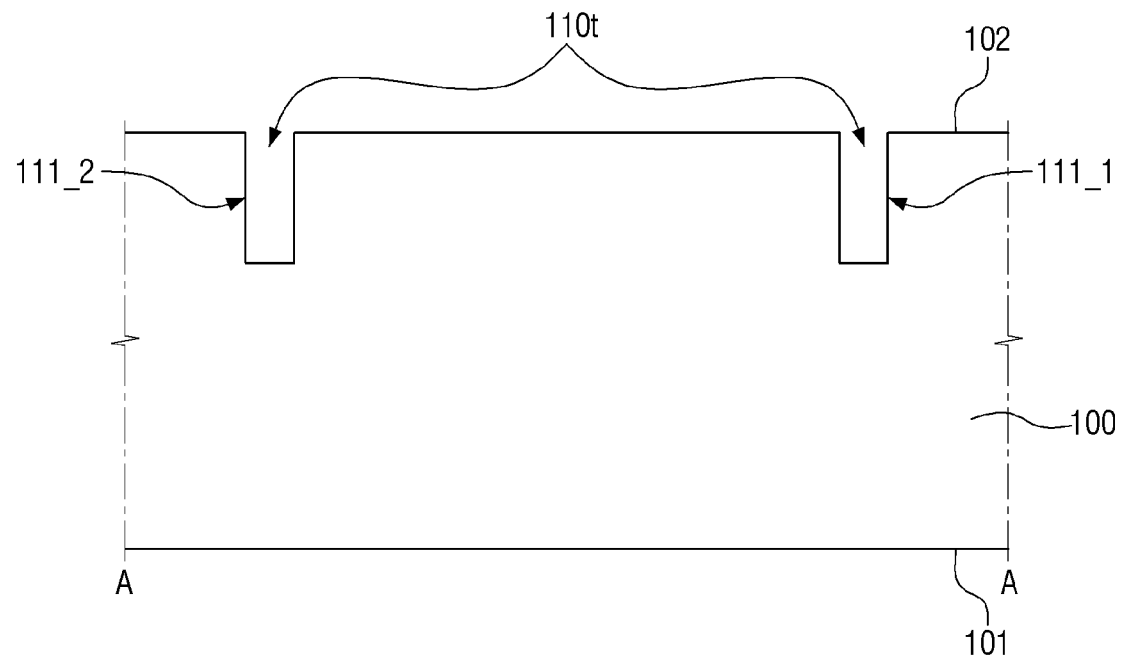
FIG. 3 is a cross-sectional view taken on line A-A of FIG. 2A.

Referring to FIGS. 1 to 3, a semiconductor device according to some exemplary embodiments includes a first semiconductor chip 100, a second semiconductor chip 200, and a first uneven pattern 110. The first uneven pattern or flow regulating structure 110 is only a conceptual representation provided for the purpose of explanation.

The first semiconductor chip 100 and/or the second semiconductor chip 200 may be, for example, memory chip(s), logic chip(s), and so on.

When the first semiconductor chip 100 and/or the second semiconductor chip 200 is(are) the logic chip(s), the first semiconductor chip 100 and/or the second semiconductor chip 200 may be designed in various manners in consideration of the operations to be performed, and so on.

When the first semiconductor chip 100 and/or the second semiconductor chip 200 is(are) the memory chip(s), the memory chip(s) may be, for example, non-volatile memory chip(s). Specifically, the memory chip may be flash memory chip. More specifically, the memory chip may be any one of NAND flash memory chips or NOR flash memory chips. On the other hand, the memory device according to the present disclosure is not limited to the specific configuration exemplified above. In a semiconductor device according to some exemplary embodiments, the memory chip may include any one of phase-change random-access memory (PRAM), magneto-resistive random-access memory (MRAM), and resistive random-access memory (RRAM).

Alternatively, one of the first semiconductor chip 100 and the second semiconductor chip 200 may be the logic chip, and the other may be the memory chip.

The first semiconductor chip 100 may include a first surface 101 and a second surface 102 opposite to each other. The first semiconductor chip 100 may include a first active region 105.

The first active region 105 may be formed on the first surface 101 of the first semiconductor chip. The first active region 105 may be a region formed with a circuit pattern such as a transistor, a diode, and so on, and an interconnect structure to electrically connect the same.

The first semiconductor chip 100 may include first through-silicon vias 120, which may extend between the second surface 102 of the first semiconductor chip 100 and the first surface 101 of the first semiconductor chip 100.

As illustrated in FIG. 1, the first through-silicon vias 120 may not entirely penetrate the first semiconductor chip 100, but this is provided only for the sake of convenience and exemplary embodiments are not limited thereto.

That is, the extent to which the first through-silicon vias 120 extend may vary depending on factors such as whether the first through-silicon vias 120 are formed before the front end of line (FEOL) process, or formed between the FEOL process and back end of line (BEOL) process, or during the BEOL process or after.

Further, as illustrated in FIG. 1, there may be three first through-silicon vias 120 formed within the first semiconductor chip 100, but this is provided only for the sake of convenience and exemplary embodiments are not limited thereto.

First lower pads 121 may be formed on the first surface 101 of the first semiconductor chip 100, and first upper pads 122 may be formed on the second surface 102 of the first semiconductor chip 100. The first lower pads 121 may be connected with an interconnect structure included in the first active region 105, and the first upper pads 122 may be connected with the first through-silicon vias 120. The first upper pads 122 may be through-via pads.

First connection terminals 125 may be connected with the first lower pads 121. The first connection terminals 125 may electrically connect the first semiconductor chip 100 with another semiconductor chip or a base substrate, and so on.

The first connection terminals 125 are illustrated as solder balls having a ball shape, but exemplary embodiments are not limited thereto. For example, the first connection terminals 125 may be a conductive bump such as a solder bump combining pillars with solder balls.

The second semiconductor chip 200 may be disposed on the first semiconductor chip 100. The second semiconductor chip 200 may be disposed on the second surface 102 of the first semiconductor chip 100, and may be connected with the first semiconductor chip 100.

The second semiconductor chip 200 may include a first surface 201 and a second surface 202 opposite to each other. The second semiconductor chip 200 may include a second active region 205. The first surface 201 of the second semiconductor chip 200 may face the second surface 102 of the first semiconductor chip 100.

The second active region 205 may be formed on the first surface 201 of the second semiconductor chip 200. The second active region 205 may be a region formed with a circuit pattern such as a transistor, a diode, and so on, and an interconnect structure to electrically connect the same.

Unlike the first semiconductor chip 100, the second semiconductor chip 200 may not include through-silicon vias.

The second lower pads 221 may be formed on the first surface 201 of the second semiconductor chip 200. The second semiconductor chip 200 may be connected with the first semiconductor chip 100 using a flip-chip technique. The second lower pads 221 may be connected with an interconnect structure included in the second active region 205.

Second connection terminals 225 may be connected with the second lower pads 221. The second connection terminals 225 may electrically connect the second semiconductor chip 200 with the first semiconductor chip 100.

The second connection terminals 225 are illustrated as solder balls having a ball shape, but exemplary embodiments are not limited thereto. Accordingly, the second connection terminals 225 may have a conductive bump such as a solder bump shape combining pillars with solder balls. When the second connection terminals 225—are formed in the shape of a solder bump, the second connection terminals 225 may be, for example, micro bumps.

A first fixing film 130 (or an adhesive layer) may be formed between the first semiconductor chip 100 and the second semiconductor chip 200. The first fixing film 130 may be formed between the second surface 102 of the first semiconductor chip 100 and the first surface 201 of the second semiconductor chip 200.

The first fixing film 130 may overlie at least a portion of a sidewall of the second semiconductor chip 200. An outer or edge portion of the first fixing film 130 extending beyond the region under the first surface 201 of the second semiconductor chip 200 may be formed along a perimeter of the second semiconductor chip 200, as illustrated in FIG. 19B.

The first fixing film 130 fills the space between the first semiconductor chip 100 and the second semiconductor chip 200, and surrounds the second connection terminals 225. The first fixing film 130 may include, for example, non-conductive film (NCF), or epoxy resin, or two or more types of silicone hybrid materials.

The first uneven pattern 110 may be formed at the second surface 102 of the first semiconductor chip 100. The first uneven pattern 110 may include a negative pattern or structure (such as a recess or a trench) formed in the second surface 102 and/or a positive pattern or structure (such as a wall, bump, or ridge) formed on the second surface 102 of the first semiconductor chip 100. The first uneven pattern 110 or the flow regulating structure can therefore be any structure that helps regulate the flow of a fixing film or an adhesive material to fix stacked semiconductor chips. The first uneven pattern 110 ideally prevents or substantially reduces the formation of voids within a multi-chip semiconductor stack package as well as excessive overflow on the edge portions of the second surface 102 (top surface) of the first semiconductor chip 100. The first uneven pattern or flow regulating structure 110 may be formed by a laser or dry etching that are suitable for implementing the present inventive concept within the spirit and scope of the present disclosure.

As illustrated in FIGS. 1 to 3, the first uneven pattern 110 may include a trench structure 110t as a negative pattern. More specifically, the first uneven pattern 110 may include the trench structure 110t at the first surface 101 of the first semiconductor chip 100, which is formed within the first semiconductor chip 100.

The trench structure 110t may be overlapped by the second semiconductor chip 200. More specifically, at least a portion of the trench structure 110t may be—overlapped by the second semiconductor chip 200 in a vertical direction.

In other words, the second semiconductor chip 200 may overlap at least a portion of the trench structure 110t, i.e., at least a portion of the first uneven pattern 110. That is, in contrast with the embodiment illustrated in FIG. 2A, the first uneven pattern 110 including the trench structure 110t may be formed on the second surface 102 of the first semiconductor chip 100 that is substantially entirely overlapped by the second semiconductor chip 200.

Referring now to FIG. 2A, the trench structure 110t will be more fully described.

The trench structure 110t may include first radial trenches 111_1, 111_2, 111_3, 111_4. At least a portion of each of the first radial trenches 111_1, 111_2, 111_3, 111_4 may be-overlapped by the second semiconductor chip 200 in the vertical direction.

More specifically, the second surface 102 of the first semiconductor chip 100 may include a pair of opposing first sides 102a and a pair of opposing second sides 102b.

Further, the second surface 102 of the first semiconductor chip 100 may include first to fourth corners $102c\_1$, $102c\_2$, $102c\_3$, $102c\_4$ which are defined as a point where the first sides 102 and the second sides 102b are connected. In other words, the first sides 102a or the second sides 102b may be defined by connecting the first to fourth corners $102c\_1$, $102c\_2$, $102c\_3$, $102c\_4$ of the second surface 102 of the first semiconductor chip 100.

Each of the first radial trenches $111\_1$, $111\_2$, $111\_3$, $111\_4$ may extend toward a respective one of the corners $102c\_1$, $102c\_2$, $102c\_3$, $102c\_4$ of the second surface 102 of the first semiconductor chip 100.

As used herein, the 'trench extending toward a corner' refers not only to—trenches extending directly-toward a corner, but also trenches extending generally toward a vicinity of a corner. Further, those skilled in the art will be easily able to discern whether or not the trench extends generally toward a corner.

Each of the first radial trenches $111\_1$, $111\_2$, $111\_3$, $111\_4$ may include long sidewalls 111a and short sidewalls 111b. At this time, those skilled in the art will be easily able to discern the long sidewalls 111a from the short sidewalls 111b of each of the first radial trenches $111\_1$, $111\_2$, $111\_3$, $111\_4$.

The long sidewalls 111a of each of the first radial trenches $111\_1$, $111\_2$, $111\_3$, $111\_4$ may extend toward respective ones of the corners $102c\_1$, $102c\_2$, $102c\_3$, $102c\_4$ of the second surface 102 of the first semiconductor chip 100.

The first radial trenches $111\_1$, $111\_2$, $111\_3$, $111\_4$ may be formed radially within the second surface 102 of the first semiconductor chip 100. For example, the first radial trenches $111\_1$, $111\_2$, $111\_3$, $111\_4$ may be disposed in a radial fashion around a center region 102r of the second surface 102 of the first semiconductor chip 100. Each of the first radial trenches $111\_1$, $111\_2$, $111\_3$, $111\_4$ may extend from the center region 102r of the second surface 102 of the first semiconductor chip 100, toward a respective one of the corners $102c\_1$, $102c\_2$, $102c\_3$, $102c\_4$ of the second surface 102 of the first semiconductor chip 100.

As illustrated in FIG. 2A, the center region 102r of the second surface 102 of the first semiconductor chip 100 may be a region where the first upper pads 122 are gathered, although this is provided only for the sake of convenience and exemplary embodiments are not limited thereto.

In some embodiments, the first upper pads 122 may be formed in not only the center region 102r of the second surface 102 of the first semiconductor chip, but also between the first radial trenches $111\_1$, $111\_2$, $111\_3$, $111\_4$. Note that the trench structure 110t including the first radial trenches $111\_1$, $111\_2$, $111\_3$, $111\_4$ are spaced apart from the first upper pads 122.

Unlike the embodiment shown in FIG. 2A, in some other embodiments, the center region 102r of the second surface 102 of the first semiconductor chip 100 may be an arbitrary region that has an area and that includes a geographical center point of the second surface 102 of the first semiconductor chip 100. Those skilled in the art will be easily able to define the center region 102r of the second surface 102 of the first semiconductor chip 100.

As illustrated in FIG. 3, each of the first radial trenches $111\_1$, $111\_2$, $111\_3$, $111\_4$ facing respective ones of the corners $102c\_1$, $102c\_2$, $102c\_3$, $102c\_4$ of the second surface 102 of the first semiconductor chip 100 may not be connected with the other ones of the first radial trenches $111\_1$, $111\_2$, $111\_3$, $111\_4$.

For example, the first radial trenches $111\_1$, $111\_2$ extending toward the first corner $102c\_1$ and the adjacent second corner $102c\_2$ of the second surface 102 of the first semiconductor chip 100, may not be connected with each other.

However, unlike the embodiment shown in FIG. 2A, the first radial trenches $111\_1$, $111\_2$ extending toward the first corner $102c\_1$ and the adjacent second corner $102c\_2$ of the second surface 102 of the first semiconductor chip 100 may be connected, and the first radial trenches $111\_3$, $111\_4$ extending toward the third corner $102c\_3$ and the adjacent fourth corner $102c\_4$ of the second surface 102 of the first semiconductor chip 100 may be connected. In this case, a portion $111\_1$, $111\_2$ of the first radial trenches and the rest $111\_3$, $111\_4$ of the first radial trenches may not be connected with each other.

That is, the first radial trenches $111\_1$, $111\_2$, $111\_3$, $111\_4$ may include two V-shaped trenches.

The first radial trenches $111\_1$, $111\_2$, $111\_3$, $111\_4$ may be formed symmetrically in the second surface 102 of the first semiconductor chip 100. That is, the first radial trenches $111\_1$, $111\_2$, $111\_3$, $111\_4$ may be formed symmetrically on opposite sides of the center region 102r of the second surface 102 of the first semiconductor chip in a y direction, or formed symmetrically on opposite sides (left and right) of the center region 102r of the second surface 102 of the first semiconductor chip in an x direction.

As used herein, the meaning of being 'formed symmetrically' refers not only to being formed in an exact symmetrical shape, but also to being formed generally symmetrically, such as in regions that are symmetric in position.

For example, first to fourth quadrants are defined in an arbitrary plane. At this time, it is assumed that a first pattern is formed in the first quadrant, and a second pattern is formed in the second quadrant in a similar shape as the first pattern. At this time, even when the position where the second pattern is formed is not in exact symmetry with the position where the first pattern is formed, the second pattern may be regarded as being formed symmetrically with the first pattern.

As illustrated in FIG. 3, the second surface 102 of the first semiconductor chip 100 may be a substantially planar and smooth surface, although this is provided only for the sake of convenience and exemplary embodiments are not limited thereto. That is, the second surface 102 of the first semiconductor chip 100 may have a different roughness than that illustrated in FIG. 3.

During the fabrication process, the first uneven pattern or flow regulating structure 110 may regulate a flow of the first fixing film 130 for fixing the first semiconductor chip 100 and the semiconductor chip 200. As a result, it may be possible to substantially reduce the formation of voids, i.e., regions not filled by the first fixing film 130 between the first semiconductor chip 100 and the second semiconductor chip 200, by regulating, containing or obstructing the flow of the first fixing film 130. Further, it may also be possible to substantially reduce the overflow of the first fixing film 130 on to the second surface 102 of the first semiconductor chip 100, i.e., to prevent portions of the first fixing film 130 from covering a peripheral region of the second surface 102 of the first semiconductor chip extensively beyond the area covered by the second semiconductor chip 200. This will be described with reference to FIGS. 19A to 20.

Figure 4:
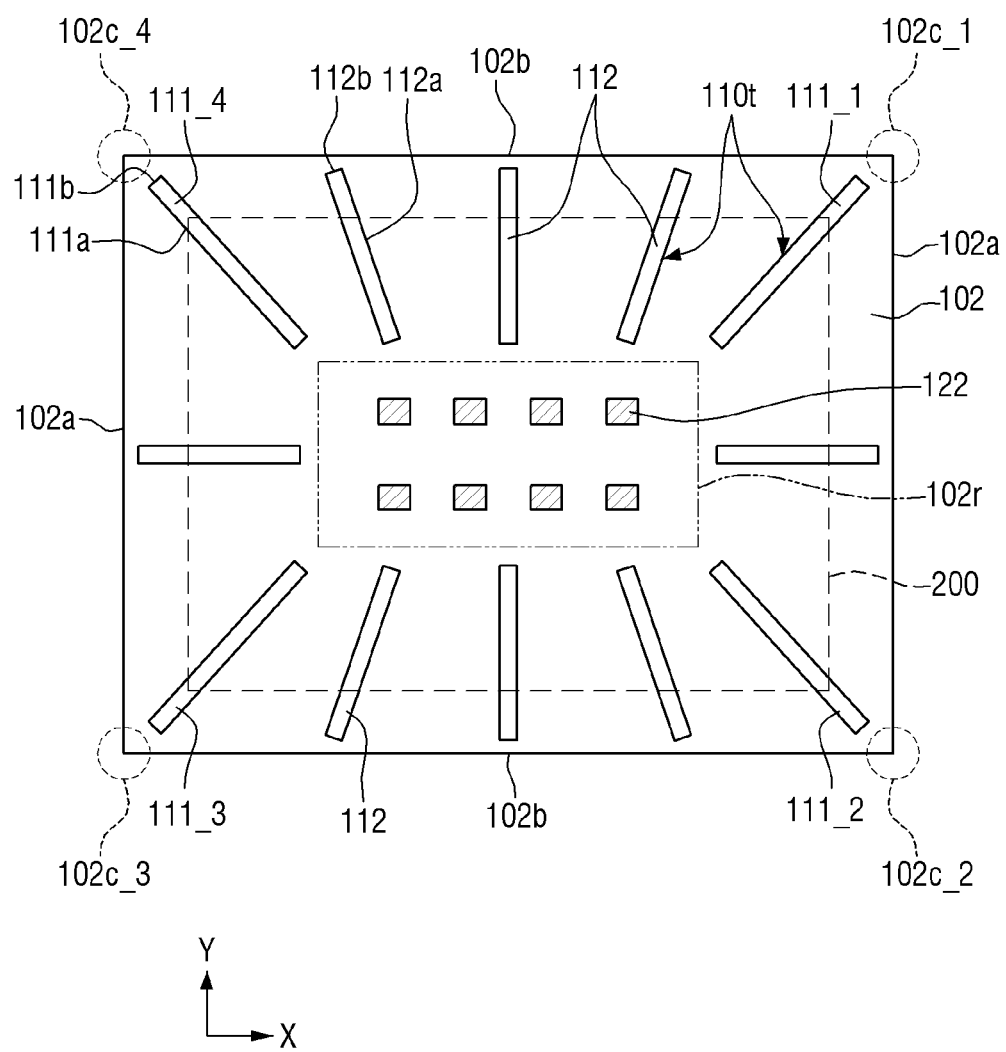
FIG. 4 is a view illustrating a semiconductor device according to some exemplary embodiments.

FIG. 4 is a plan view illustrating a semiconductor device including a first uneven pattern formed on the second surface 102 of the first semiconductor chip 100 of FIG. 1 according to some exemplary embodiments. For the sake of simplicity, the following description will focus on differences from the exemplary embodiments described with reference to FIGS. 1 to 3.

Referring to FIG. 4, in a semiconductor device according to some exemplary embodiments, the trench structure 110t may further include second radial trenches 112.

The second radial trenches 112 may be formed between the first radial trenches 111_1, 111_2, 111_3, 111_4 adjacent to each other. At least a portion of each of the second radial trenches 112 may be overlapped by the second semiconductor chip 200 in a vertical direction.

The first radial trenches 111_1, 111_2, 111_3, 111_4 and the second radial trenches 112 may be formed radially within the second surface 102 of the first semiconductor chip 100. The first radial trenches 111_1, 111_2, 111_3, 111_4 and the second radial trenches 112 may be disposed radially around the center region 102r of the second surface 102 of the first semiconductor chip 100.

The second radial trenches 112 may extend toward the first sides 102a or the second sides 102b, rather than extending toward each of the corners 102c_1, 102c_2, 102c_3, 102c_4 of the second surface 102 of the first semiconductor chip 100.

Each of the second radial trenches 112 may include a long sidewall 112a and a short sidewall 112b. The long sidewall 112a of each of the second radial trenches 112 may extend toward the first sides 102a or the second sides 102b of the second surface 102 of the first semiconductor chip 100.

As illustrated in FIG. 4, the number of second radial trenches 112 extending toward the first sides 102a of the second surface 102 of the first semiconductor chip may be different from the number of second radial trenches 112 extending toward the second sides 102b of the second surface 102 of the first semiconductor chip, but not limited thereto.

In some embodiments, there may be one second radial trench 112 extending toward either of the first sides 102a of the second surface 102 of the first semiconductor chip 100, and three second radial trenches 112 extending toward either of the second sides 102b of the second surface 102 of the first semiconductor chip, but exemplary embodiments are not limited thereto.

Additionally, differently from the embodiment shown in FIG. 4, the second radial trenches 112 may be formed only between the first radial trench 111_1 extending toward the first corner 102c_1 and the first radial trench 111_2 extending toward the second corner 102c_2, and between the first radial trench 111_3 extending toward the third corner 102c_3 and the first radial trench 111_4 extending toward the fourth corner 102c_4.

In contrast, the second radial trenches 112 may be formed only between the first radial trench 111_1 extending toward the first corner 102c_1 and the first radial trench 111_4 extending toward the fourth corner 102c_2, and between the first radial trench 111_2 extending toward the second corner 102c_2 and the first radial trench 111_3 extending toward the third corner 102c_3.

The second radial trenches 112 may be formed substantially symmetrically on the second surface 102 of the first semiconductor chip 100.

Figure 5:
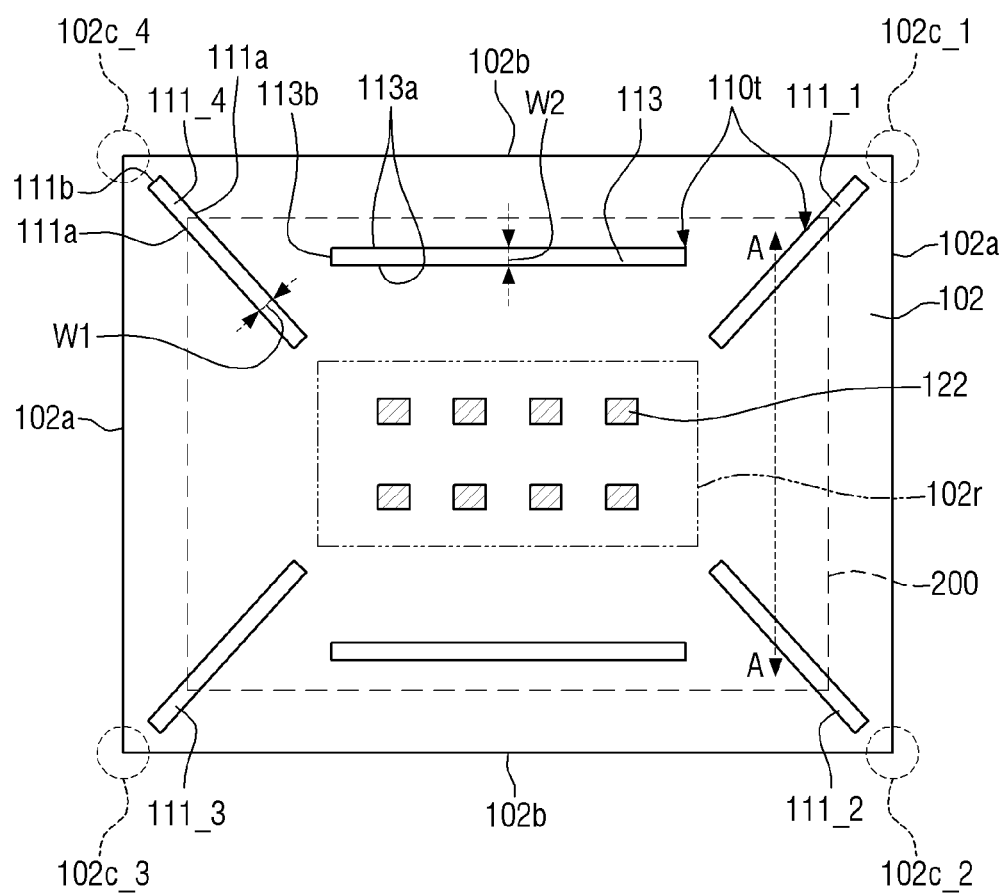
FIG. 5 is a view illustrating a semiconductor device according to some exemplary embodiments.

FIG. 5 is a plan view illustrating a semiconductor device having a first uneven pattern formed on the second surface 102 of the first semiconductor chip 100 of FIG. 1 according to some embodiments. For the sake of simplicity, the following description will focus on differences from the exemplary embodiments described with reference to FIGS. 1 to 3.

Referring to FIG. 5, the trench structure 110t formed in the second surface 102 of the first semiconductor chip 100 may further include first parallel trenches 113.

In some embodiments, the first parallel trenches 113 may be formed between the first radial trench 111_1 extending toward the first corner 102c_1 and the first radial trench 111_4 extending toward the fourth corner 102c_4, and between the first radial trench 111_2 extending toward the second corner 102c_2 and the first radial trench 111_3 extending toward the third corner 102c_3.

In some embodiments, the first parallel trenches 113 may extend along (e.g., substantially parallel with) the second sides 102b of the second surface 102 of the first semiconductor chip 100.

More specifically, the first parallel trenches 113 may each include long sidewalls 113a and short sidewalls 113b. The long sidewalls 113a of the first parallel trenches may extend along either of the second sides 102b of the second surface 102 of the first semiconductor chip 100.

The first parallel trenches 113 may be formed on opposite sides of the center region 102r of the second surface 102 of the first semiconductor chip 100 in a y direction. Further, the long sidewalls 113a of the respective first parallel trenches 113 extending along the second sides 102b of the second surface 102 of the first semiconductor chip 100 may face each other.

The first parallel trenches 113 may not be connected with the first radial trenches 111_1, 111_2, 111_3, 111_4. That is, the first parallel trenches 113 may be spaced apart from the first radial trenches 111_1, 111_2, 111_3, 111_4.

The first radial trenches 111_1, 111_2, 111_3, 111_4 may have a first width W1, measured between the long sidewalls 111a facing each other, and the first parallel trenches 113 may have a second width W2, measured between the long sidewalls 113a facing each other.

As illustrated in FIG. 5, the width W1 of the first radial trenches 111_1, 111_2, 111_3, 111_4 may be equal to the width W2 of the first parallel trenches 113, although the exemplary embodiments are not limited thereto. Accordingly, it is also possible that the width W1 of the first radial trenches 111_1, 111_2, 111_3, 111_4 is different from the width W2 of the first parallel trenches 113.

Figure 6:
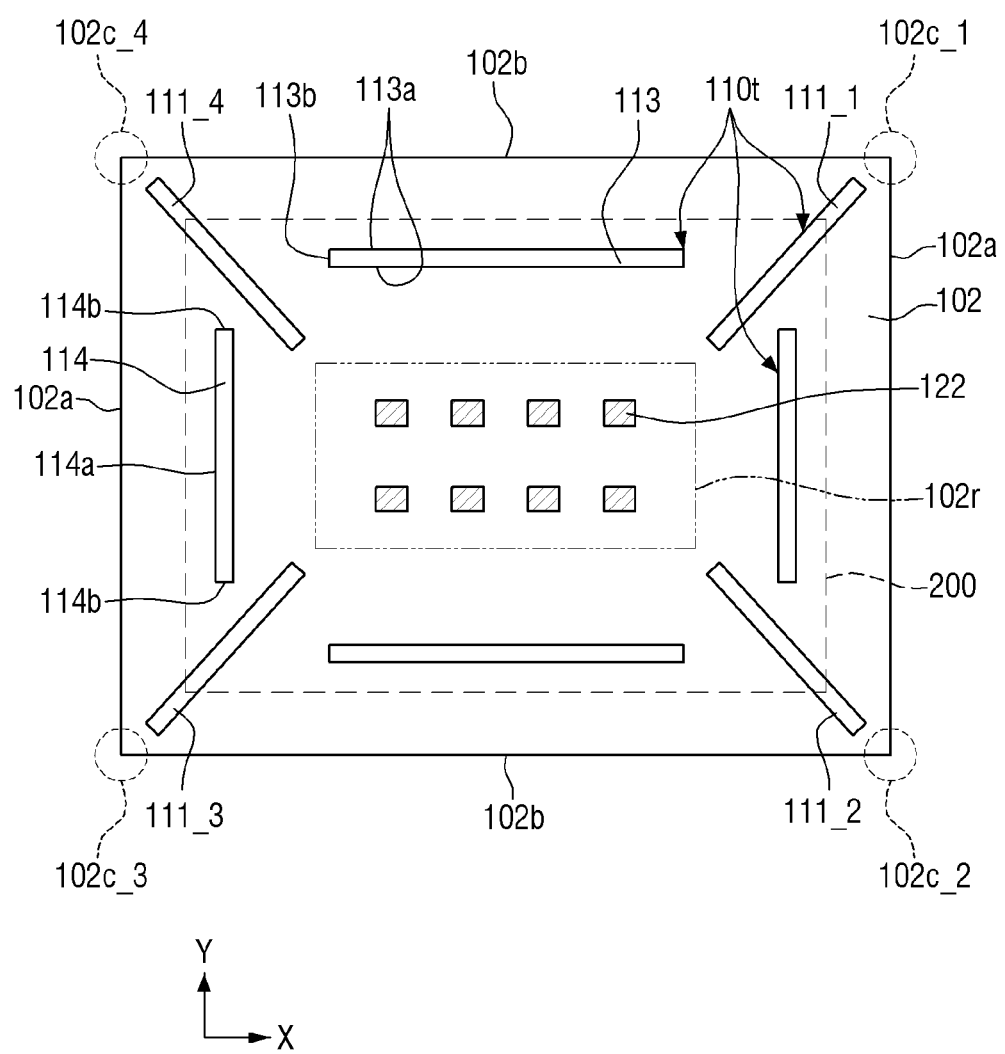
FIG. 6 is a view illustrating a semiconductor device according to some exemplary embodiments.
Figure 7:
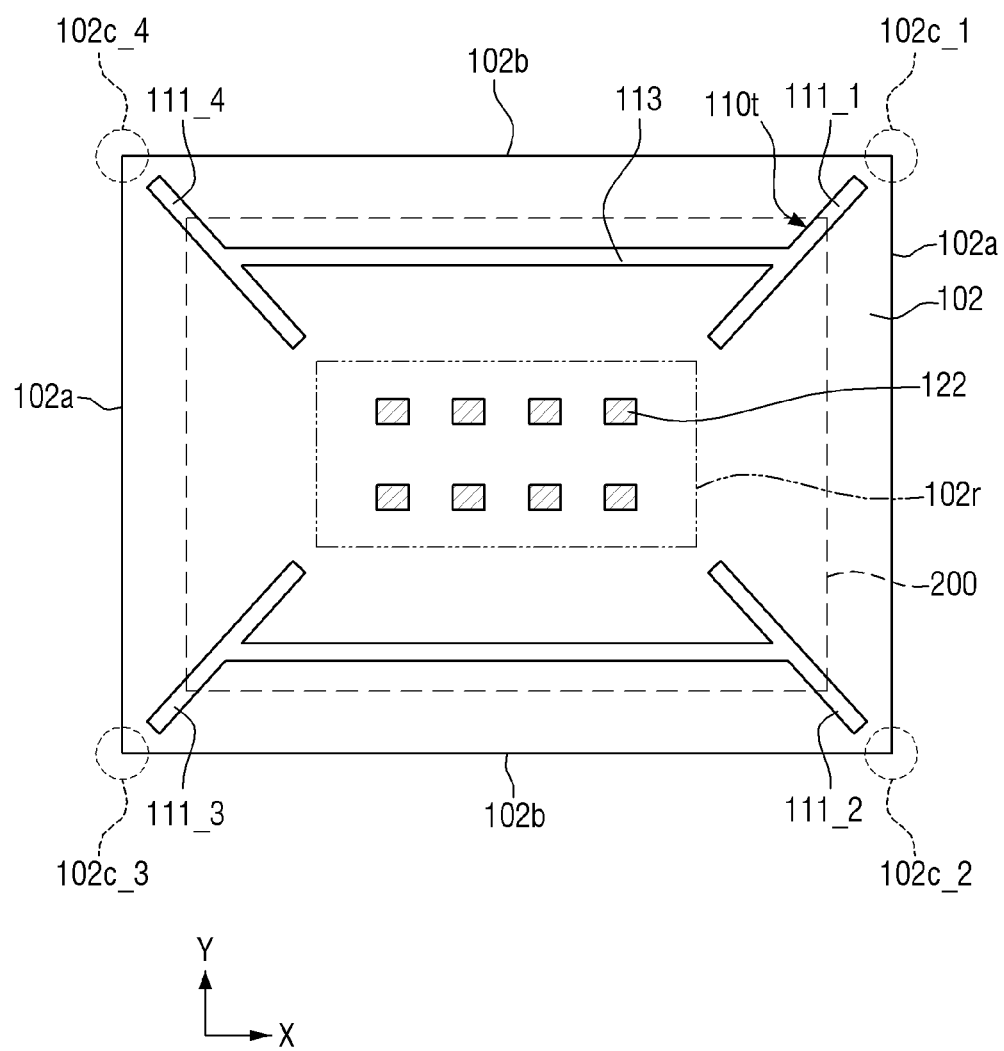
FIG. 7 is a view illustrating a semiconductor device according to some exemplary embodiments.

FIG. 6 is a plan view illustrating a semiconductor device according to some exemplary embodiments. FIG. 7 is a plan view illustrating a semiconductor device according to some exemplary embodiments. For the sake of simplicity, the following description will focus on differences that are not explained above with reference to FIG. 5.

Referring to FIG. 6, in a semiconductor device according to some exemplary embodiments, the trench structure 110t may further include second parallel trenches 114.

The second parallel trenches 114 may be formed between the first radial trench 111_1 extending toward the first corner 102c_1 and the first radial trench 111_2 extending toward the second corner 102c_2, and between the first radial trench 111_3 extending toward the third corner 102c_3 and the first radial trench 111_4 extending toward the fourth corner 102c_4.

The second parallel trenches 114 may extend along either of the first sides 102a of the second surface 102 of the first semiconductor chip 100.

More specifically, each of the second parallel trenches 114 may include long sidewalls 114a and short sidewalls 114b. The long sidewalls 114a of the second parallel trenches may extend along either of the first sides 102a of the second surface 102 of the first semiconductor chip 100.

The second parallel trenches 114 may be formed on opposite sides of the center region 102r of the second surface 102 of the first semiconductor chip 100 in an x direction. Further, the long sidewalls 114a of the respective second parallel trenches 114 extending along either of the first sides 102a of the second surface 102 of the first semiconductor chip 100 may face each other.

The second parallel trenches 114 may not be connected with the first radial trenches 111_1, 111_2, 111_3, 111_4. That is, the first parallel trenches 113 may be formed to be spaced apart from the first radial trenches 111_1, 111_2, 111_3, 111_4.

Further, the second parallel trenches 114 may be spaced apart from the first parallel trenches 113.

Each of the first radial trenches 111_1, 111_2, 111_3, 111_4 may extend toward corresponding ones of the corners 102c_1, 102c_2, 102c_3, 102c_4 of the second surface 102 of the first semiconductor chip 100, between the short sidewalls 113b of the first parallel trenches 113 and the short sidewalls 114b of the second parallel trenches 114.

Referring to FIG. 7, in a semiconductor device according to some exemplary embodiments, the first radial trenches 111_1, 111_2, 111_3, 111_4 may be connected with the first parallel trenches 113.

As illustrated in FIG. 7, the trench structure 110t formed on opposites of the center region 102r of the second surface 102 of the first semiconductor chip 100 in a y direction may have a substantially H-shape, although this is provided only for the sake of convenience and exemplary embodiments are not limited thereto.

In some embodiments, the first parallel trench 113 formed between the first radial trench 111_1 extending toward the first corner 102c_1 and the fourth radial trench 111_4 extending toward the fourth corner 102c_4 may be connected with a portion of corresponding ones of the first radial trenches 111_1, 111_4.

Figure 8A:
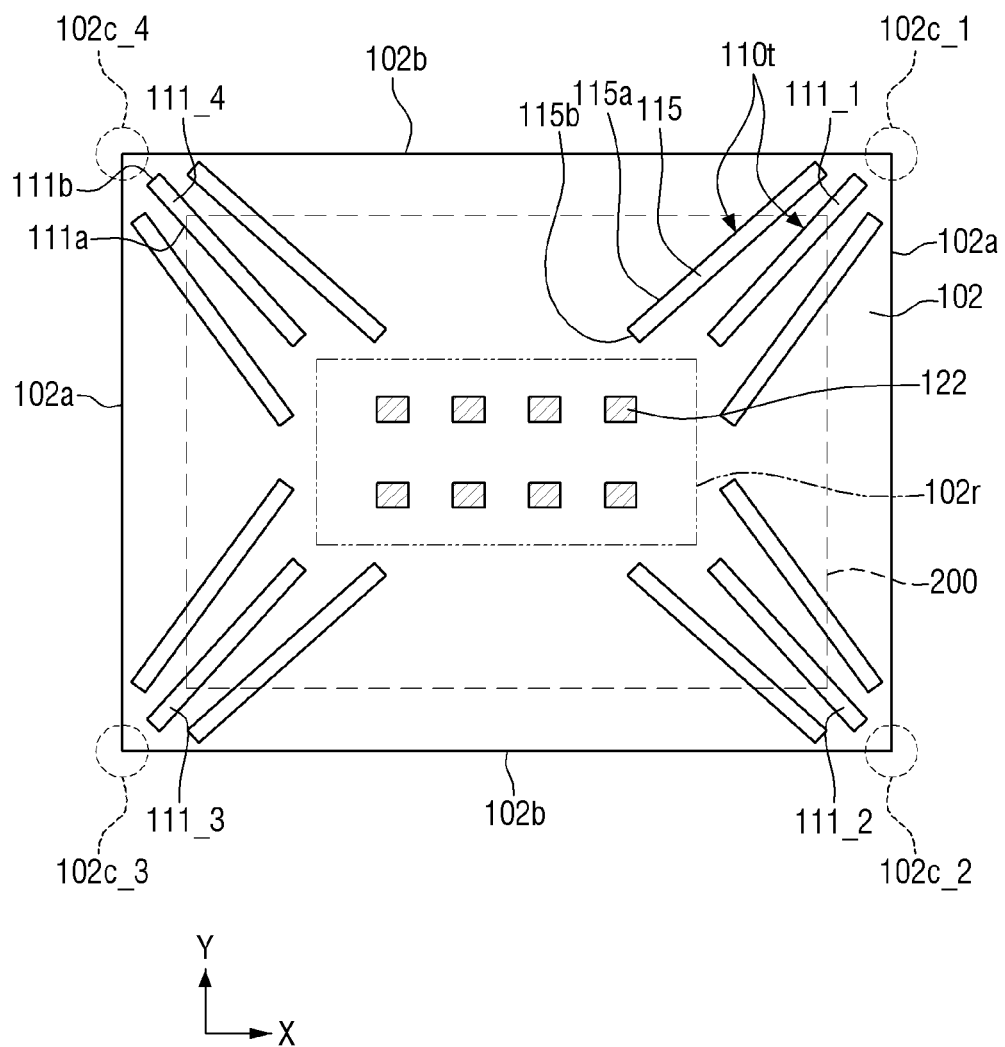
FIG. 8A is a plan view illustrating a semiconductor device according to some exemplary embodiments.

FIG. 8A is a view illustrating a semiconductor device according to some exemplary embodiments. For the sake of simplicity, the following description will focus on the differences from the exemplary embodiments described with reference to FIGS. 1 to 3.

FIG. 8A is a view illustrating a first uneven pattern or flow relating structure formed in the second surface 102 of the first semiconductor chip 100 of FIG. 1.

Referring to FIG. 8A, in a semiconductor device according to some exemplary embodiments, the trench structure 110t may further include auxiliary radial trenches 115.

The auxiliary radial trenches 115 may be formed adjacent to each of the first radial trenches 111_1, 111_2, 111_3, 111_4.

The auxiliary radial trench 115 may extend toward each of the corners 102c_1, 102c_2, 102c_3, 102c_4 of the second surface 102 of the first semiconductor chip 100.

The auxiliary radial trenches 115 may each include long sidewalls 115a and short sidewalls 115b. The long sidewalls 115a of the auxiliary radial trenches 115 may extend toward each of the corners 102c_1, 102c_2, 102c_3, 102c_4 of the second surface 102 of the first semiconductor chip 100.

The auxiliary radial trenches 115 may extend from the center region 102r of the second surface 102 of the first semiconductor chip 100, toward each of the corners 102c_1, 102c_2, 102c_3, 102c_4 of the second surface 102 of the first semiconductor chip 100.

That is, in a semiconductor device according to some exemplary embodiments, there may be a plurality of radial trenches that extend toward each of the corners 102c_1, 102c_2, 102c_3, 102c_4 of the second surface 102 of the first semiconductor chip 100.

The auxiliary radial trenches 115 may not be formed parallel with each of the first radial trenches 111_1, 111_2, 111_3, 111_4 adjacent thereto.

For example, the distance between the first radial trench 111_1 extending toward the first corner 102c_1 and the auxiliary radial trench 115 may vary as the distance from the first corner 102c_1 increases. More specifically, as the distance from the first corner 102c_1 increases, the distance between the first radial trench 111_1 and the auxiliary radial trench 115 adjacent to the first radial trench 111_1 may increase.

In other words, the first radial trench 111_1 extending toward the first corner 102c_1, and the auxiliary radial trench 115 may converge toward the first corner 102c_1.

As illustrated in FIG. 8A, there may be two auxiliary radial trenches 115 formed adjacent to each of the first radial trenches 111_1, 111_2, 111_3, 111_4, although this is provided only for the sake of convenience and the exemplary embodiments are not limited thereto.

Figure 9:
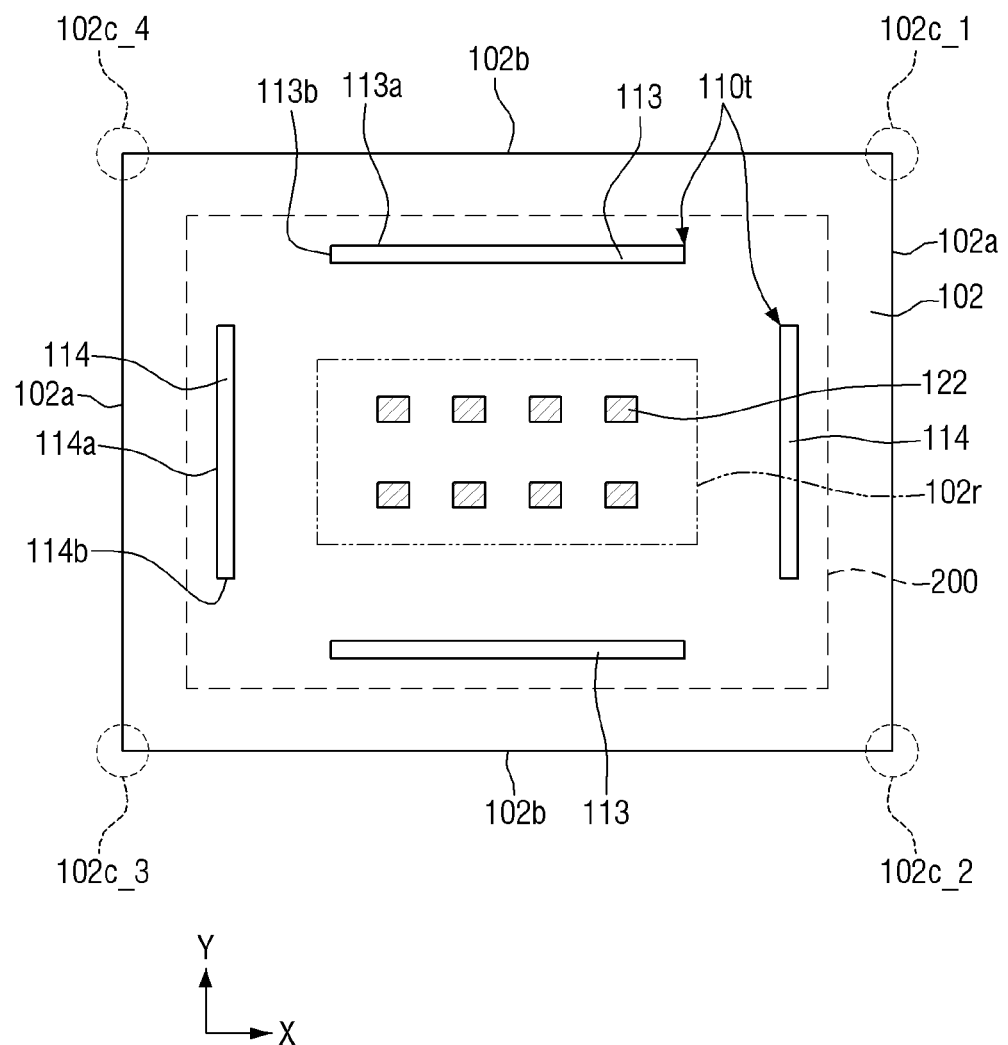
FIG. 9 is a view illustrating a semiconductor device according to some exemplary embodiments.

FIG. 9 is a view illustrating to explain a semiconductor device according to some exemplary embodiments. For the sake of simplicity, the following description will focus on differences from the exemplary embodiments described with reference to FIGS. 1 to 3.

Referring to FIG. 9, in a semiconductor device according to some exemplary embodiments, the first radial trenches 111_1, 111_2, 111_3, 111_4 extending toward corresponding ones of the corners 102c_1, 102c_2, 102c_3, 102c_4 are not formed.

The trench structure 110t may include first parallel trenches 113 and second parallel trenches 114. The first parallel trenches 113 and the second parallel trenches 114 may be formed along a perimeter of the second surface 102 of the first semiconductor chip.

The first parallel trenches 113 and the second parallel trenches 114 may not be connected with each other.

Figure 10:
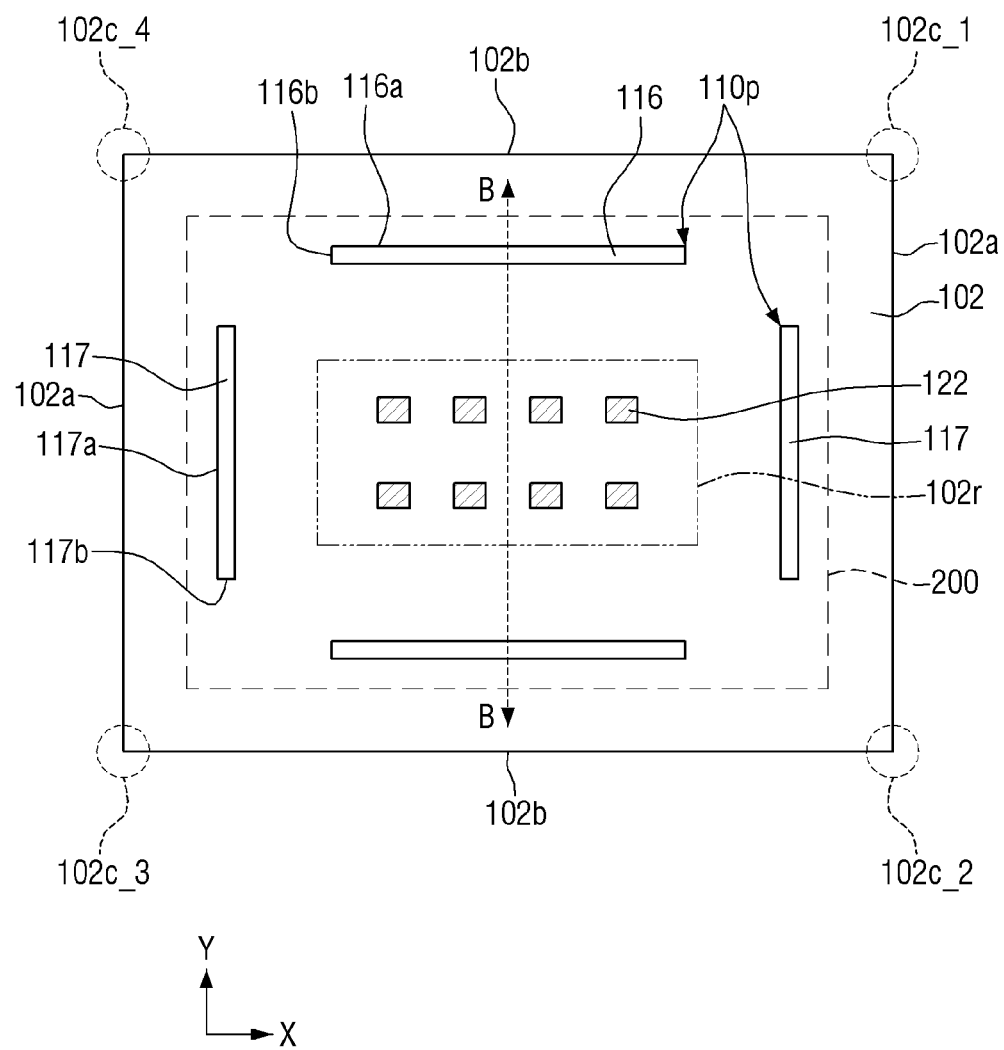
FIG. 10 is a view illustrating a semiconductor device according to some exemplary embodiments.
Figure 11:
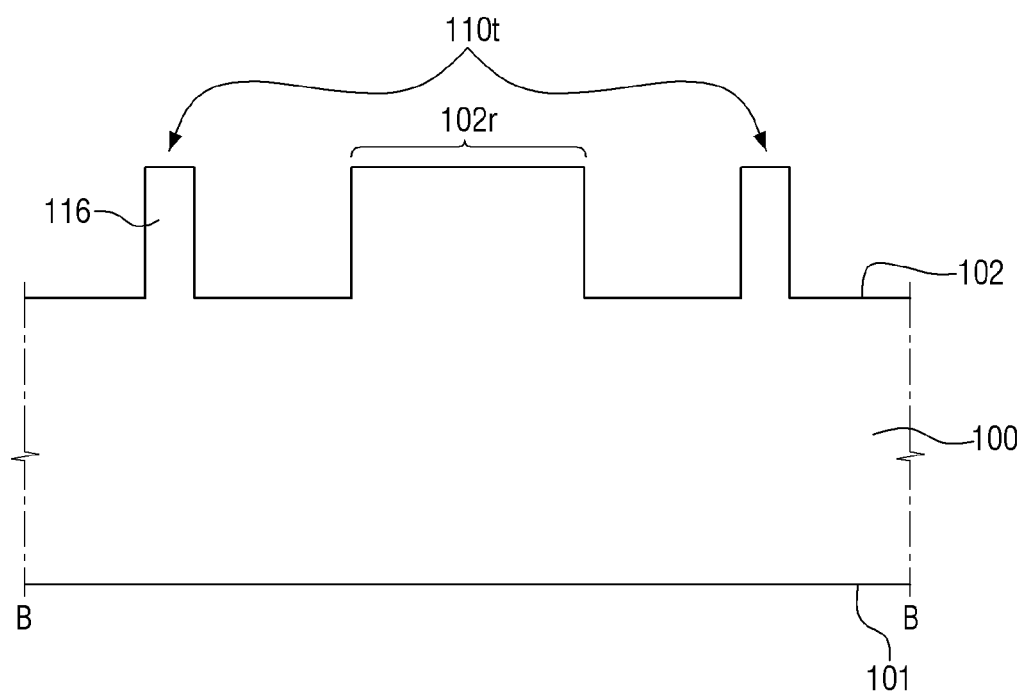
FIG. 11 is a cross sectional view taken on line B-B of FIG. 10.

FIG. 10 is a view illustrating a semiconductor device according to some exemplary embodiments. FIG. 11 is a cross sectional view taken on line B-B of FIG. 10. For the sake of simplicity, the following description will focus on the, differences from the exemplary embodiments described with reference to FIGS. 1 to 3.

Referring to FIGS. 10 and 11, in a semiconductor device according to some exemplary embodiments, the first uneven pattern 110 may include a protruding structure 110p which is a positive pattern. The protruding structure 110p may protrude from the second surface 102 of the first semiconductor chip 100.

The protruding structure 110p may be overlapped by the second semiconductor chip 200. More specifically, at least a portion of the protruding structure 110p may be overlapped by the second semiconductor chip 200 in a vertical direction.

In other words, the second semiconductor chip 200 may overlap at least a portion of the protruding structure 110p, i.e., at least a portion of the first uneven pattern 110 in a vertical direction.

The protruding structure 110p may include first protruding patterns 116 and second protruding patterns 117.

The first protruding patterns 116 may extend along the second sides 102b of the second surface 102 of the first semiconductor chip 100, and the second protruding pattern 117 may extend along the first sides 102a of the second surface 102 of the first semiconductor chip.

Each of the first protruding patterns 116 may include long sidewalls 116a and short sidewalls 116b. The long sidewalls 116a of the first protruding patterns 116 may extend along either of the second sides 102b of the second surface 102 of the first semiconductor chip 100.

The protruding patterns 116 may be formed on opposite sides of the center region 102r of the second surface 102 of the first semiconductor chip 100 therebetween in a y direction. Further, the long sidewalls 116a of the respective first protruding patterns extending along the second sides 102b of the second surface 102 of the first semiconductor chip 100 may face each other.

The second protruding patterns 117 may include long sidewalls 117a and short sidewalls 117b. The long sidewalls 117a of the second protruding patterns may extend along the first sides 102a of the second surface 102 of the first semiconductor chip 100.

The second protruding patterns 117 may be formed on opposites of the center region 102r of the second surface 102 of the first semiconductor chip therebetween in an x direction. Further, the long sidewalls 117a of the respective second protruding patterns extending along the first sides 102a of the second surface 102 of the first semiconductor chip may face each other.

The first protruding patterns 116 and the second protruding patterns 117 may not be connected. That is, the first protruding patterns 116 and the second protruding patterns 117 may be formed spaced apart from each other.

As illustrated in FIG. 11, forming of the protruding structure 110p may result in protruding of the center region 102r of the second surface 102 of the first semiconductor chip 100 from the second surface 102 of the first semiconductor chip 100, like the protruding structure 110p.

Unlike the embodiment shown in FIG. 10, the protruding structure 110p may include only the first protruding patterns 116 or only the second protruding patterns 117.

Further, the protruding structure 110p may be—overlapped by the second semiconductor chip 200 entirely in a vertical direction.

Figure 12:
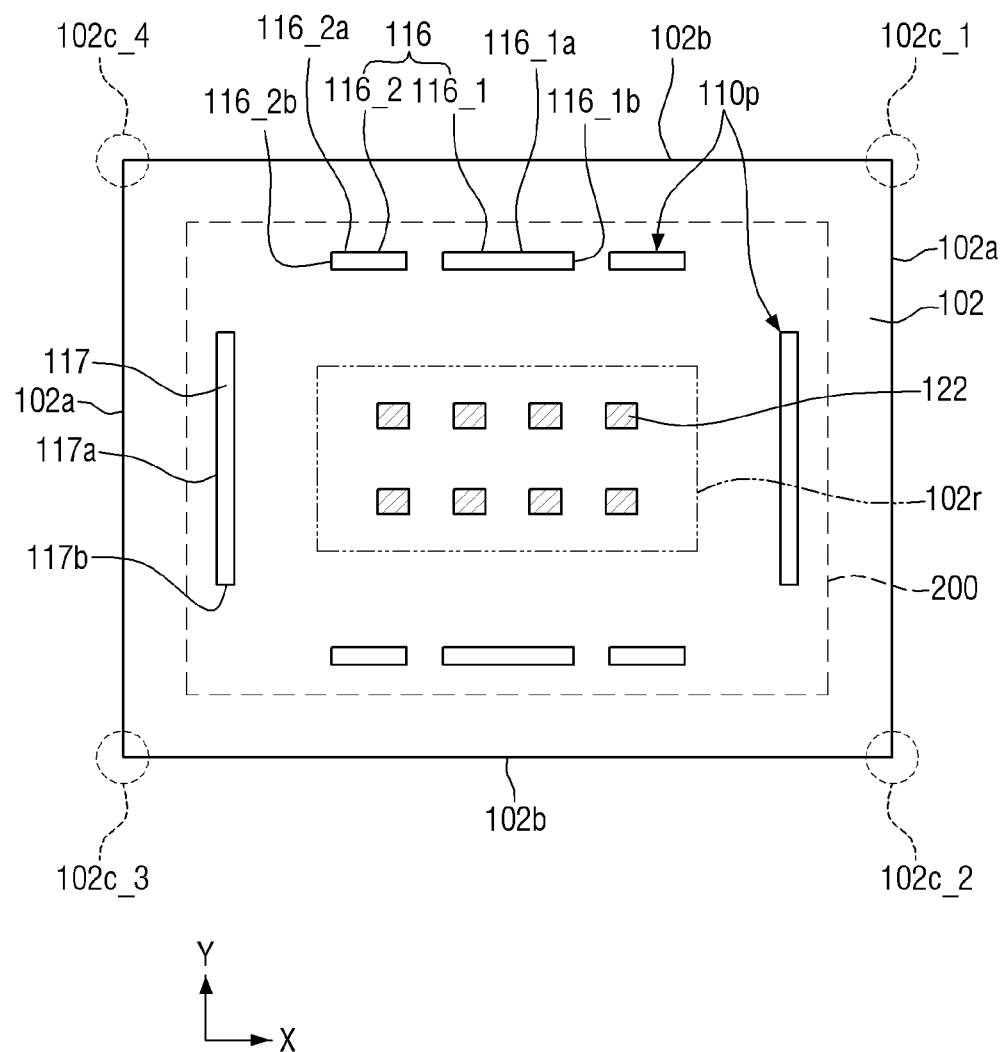
FIG. 12 is a view illustrating a semiconductor device according to some exemplary embodiments.

FIG. 12 is a view illustrating a semiconductor device according to some exemplary embodiments. For the sake of convenience, the following description will focus on differences that are not explained above with reference to FIGS. 10 and 11.

Referring to FIG. 12, in a semiconductor device according to some exemplary embodiments, the first protruding patterns 116 may include a plurality of sub-protruding patterns 116_1, 116_2. That is, the first protruding patterns 116 may include first sub-protruding patterns 116_1 and second sub-protruding patterns 116_2.

The first sub-protruding patterns 116_1 and the second sub-protruding patterns 116_2 may be spaced apart from each other.

The first sub-protruding patterns 116_1 and the second sub-protruding patterns 116_2 may each extend along the second sides 102b of the second surface 102 of the first semiconductor chip 100.

The long sidewalls 116_1a of the first sub-protruding patterns 116_1 and the long sidewalls 116_2a of the second sub-protruding patterns 116_2 may extend along the second sides 102b of the second surface 102 of the first semiconductor chip 100.

Further, the short sidewalls 116_1b of the first sub-protruding patterns 116_1 and the short sidewalls 116_2b of the second sub-protruding patterns 116_2 may face each other.

As illustrated in FIG. 12, the first protruding patterns 116 may have three sub-protruding patterns, but this is provided only for the sake of convenience and the present disclosure is not limited thereto. For example, there can be more or less than three sub-protruding patterns.

Further, unlike the embodiment illustrated in FIG. 12, the second protruding patterns 117 may include a plurality of sub-protruding patterns.

In some embodiments, the protruding structure may further include a third protruding pattern (not illustrated) extending adjacent the first side 102a and being spaced apart from the first protruding pattern 116 and the second protruding pattern 117. The third protruding pattern may include a long sidewall and a short sidewall, and the long sidewall of the third protruding pattern extends along the first side 102a, and the short sidewall of the third protruding pattern faces the short sidewall of the first protruding pattern 116.

Figure 13:
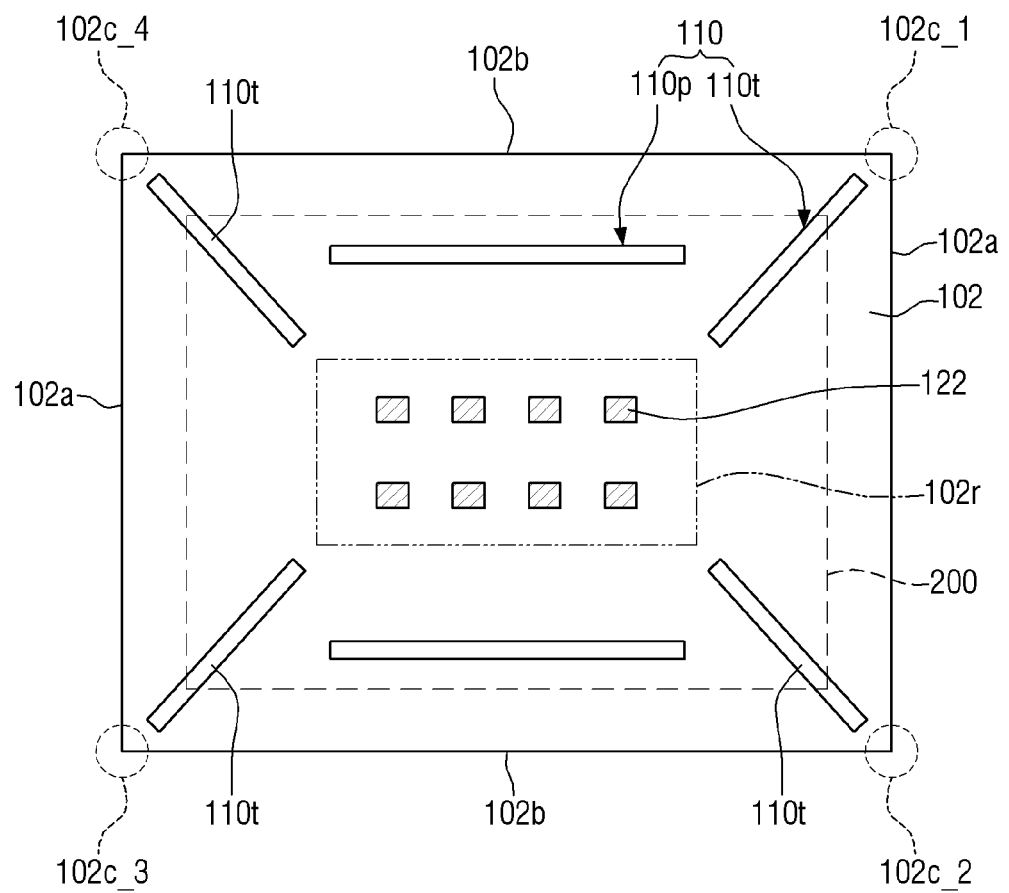
FIG. 13 is a view illustrating a semiconductor device according to some exemplary embodiments.

FIG. 13 is a view illustrating a semiconductor device according to some exemplary embodiments. For the sake of convenience, the following description will focus on differences that are not explained above with reference to FIGS. 10 and 11.

Referring to FIG. 13, in a semiconductor device according to some exemplary embodiments, the first uneven pattern 110 may include the trench structure 110t and the protruding structure 110p.

As illustrated in FIG. 13, the description about the protruding structure 110p will be omitted, as this may be substantially identical to that provided above with reference to FIGS. 10 and 11.

The trench structures 110t may extend toward corresponding ones of the corners 102c_1, 102c_2, 102c_3, 102c_4 of the second surface 102 of the first semiconductor chip 100.

Referring to FIGS. 1 to 13, in a semiconductor device according to some exemplary embodiments, the first uneven pattern 110 may include the trench structure 110t as the negative pattern, may include the protruding structure 110p as the positive pattern, or may include both the trench structure 110t and the protruding structure 110p.

Further, referring to FIGS. 1 to 13, in a semiconductor device according to some exemplary embodiments, the first uneven pattern 110 may be formed symmetrically on the second surface 102 of the first semiconductor chip 100.

Figure 14:
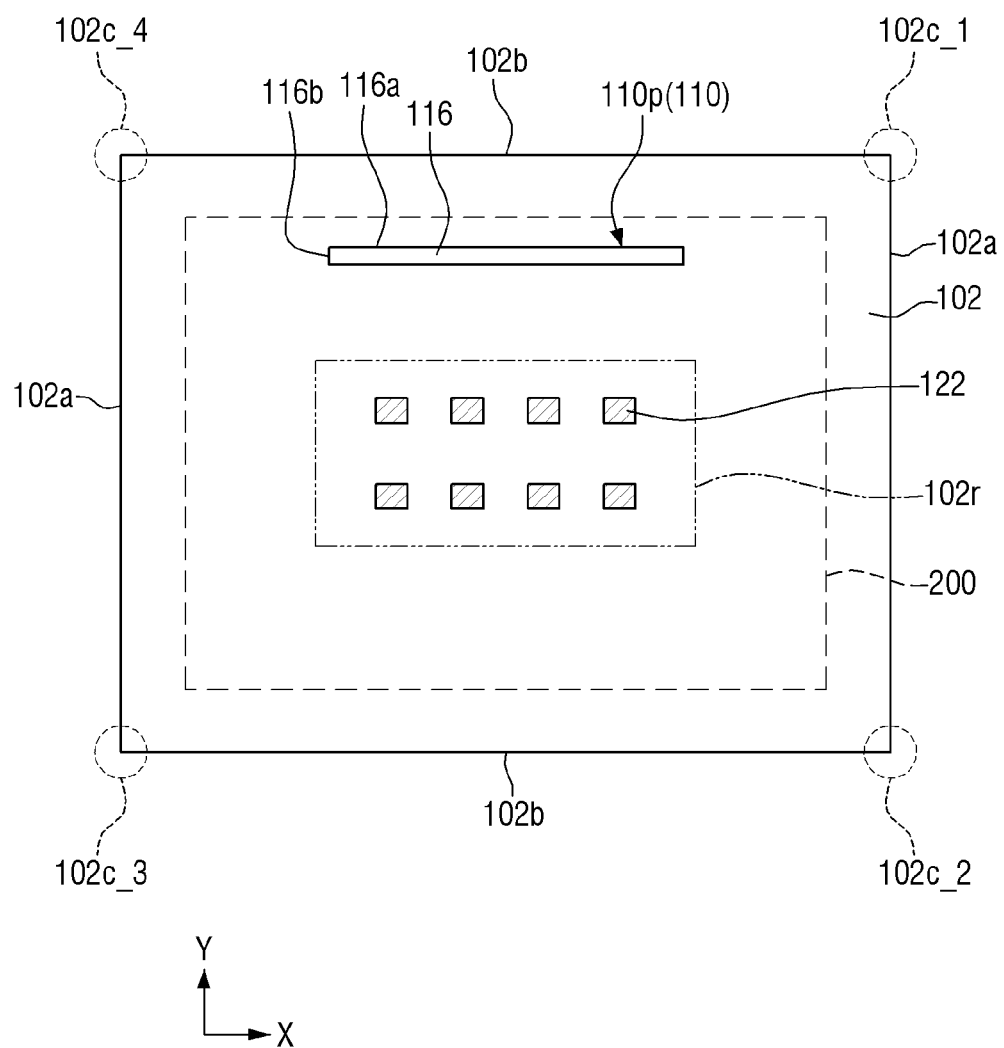
FIG. 14 is a view illustrating a semiconductor device according to some exemplary embodiments.
Figure 15:
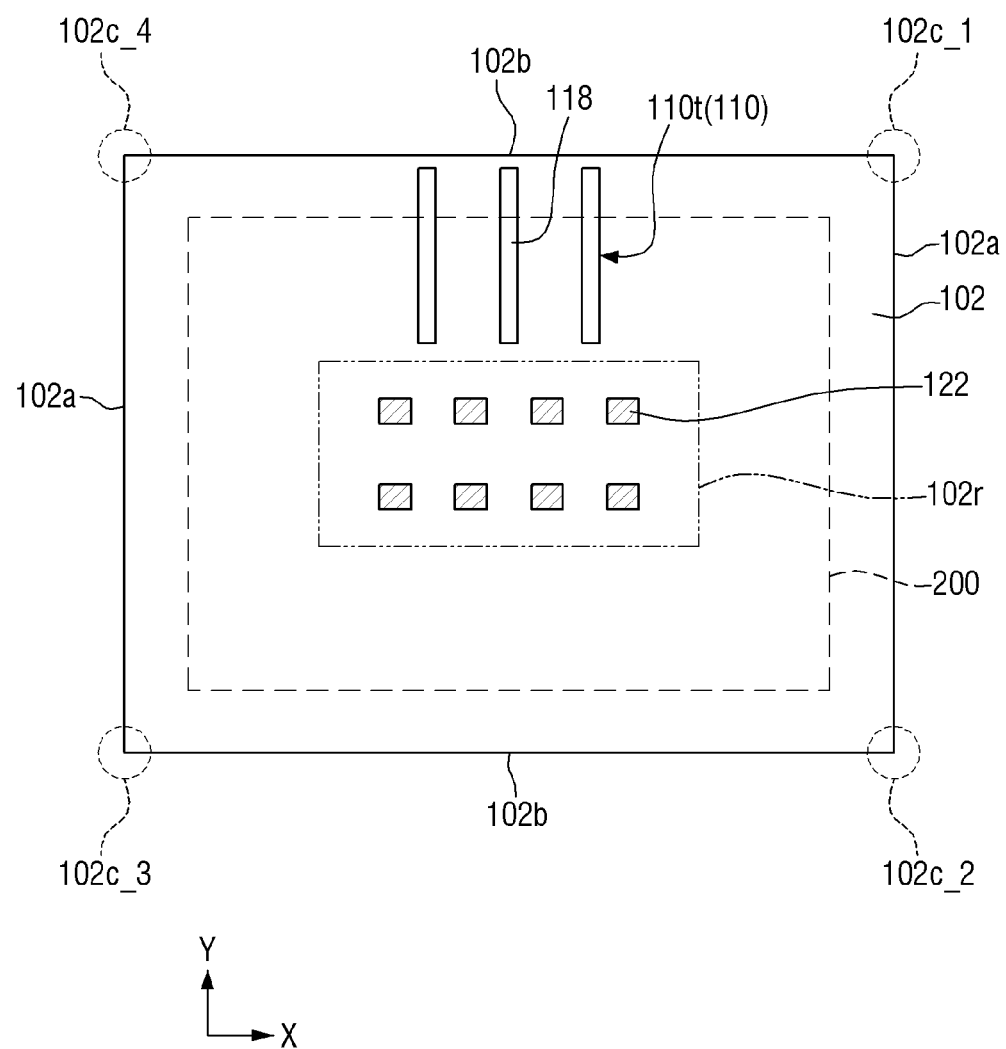
FIG. 15 is a view illustrating a semiconductor device according to some exemplary embodiments.

FIG. 14 is a view illustrating a semiconductor device according to some exemplary embodiments. FIG. 15 is a view illustrating a semiconductor device according to some exemplary embodiments.

Referring to FIGS. 14 and 15, in a semiconductor device according to some exemplary embodiments, the first uneven pattern 110 may be formed on one side of the center region 102r of the second surface 102 of the first semiconductor chip 100, and not formed on the other side.

As illustrated in FIG. 14, the first uneven pattern 110 may include the protruding structure 110p. More specifically, the protruding structure 110p may include the first protruding patterns 116.

The long sidewalls 116a of the first protruding patterns formed on only one side of the center region 102r of the second surface 102 of the first semiconductor chip may extend along the second side 102b of the second surface 102 of the first semiconductor chip 100.

As illustrated in FIG. 15, the first uneven pattern 110 may include the trench structure 110t. More specifically, the first uneven pattern 110 may include third radial trenches 118.

The third radial trenches 118 may extend toward one of the second sides 102b of the second surface 102 of the first semiconductor chip 100. In this case, the long sidewalls of the third radial trenches 118 may extend substantially parallel with the first sides 102a of the second surface 102 of the first semiconductor chip 100.

Referring to FIGS. 14 to 15, in a semiconductor device according to some exemplary embodiments, the first uneven pattern 110 may be formed symmetrically on the second surface 102 of the first semiconductor chip. The shapes illustrated in FIGS. 14 and 15 are provided only for example, and exemplary embodiments are not limited thereto.

Figure 16:
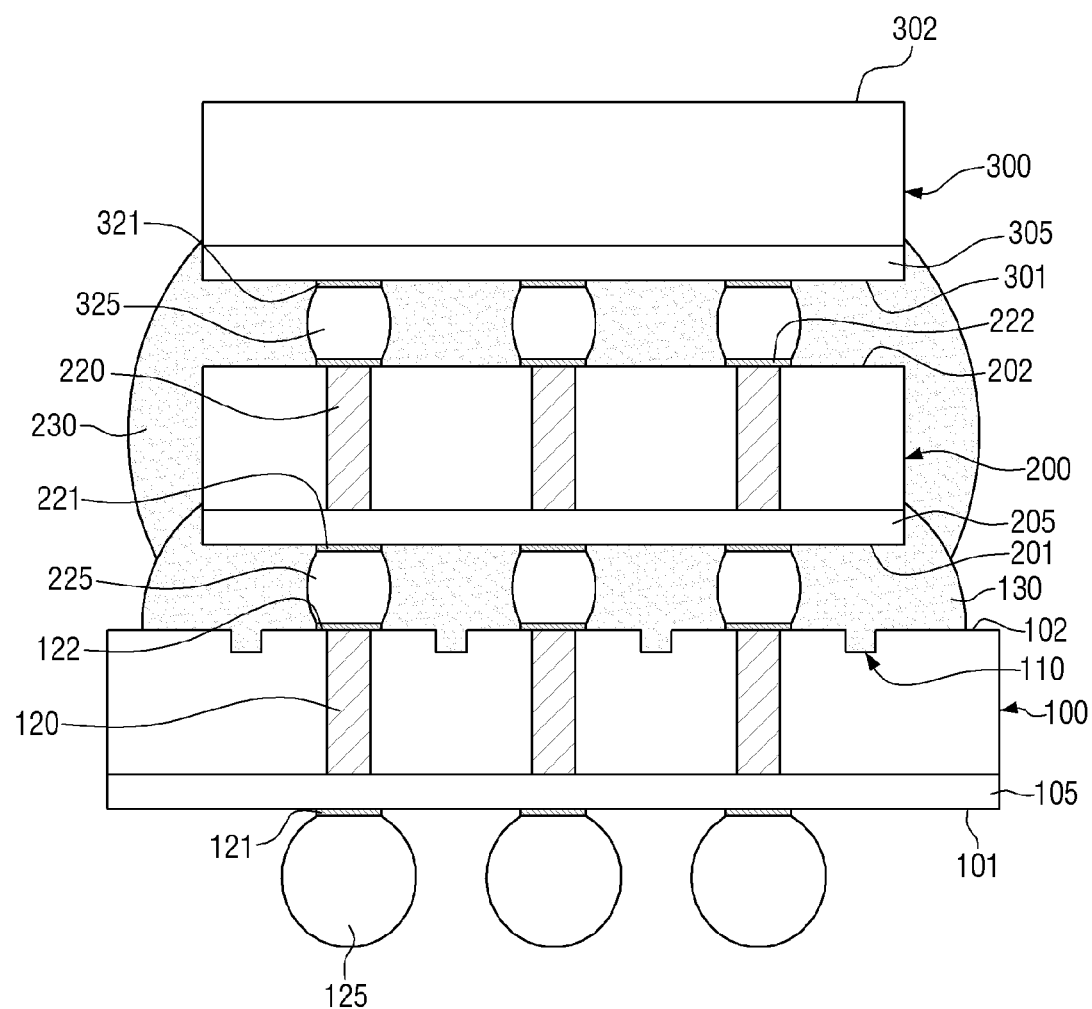
FIG. 16 is a view illustrating a semiconductor device according to some exemplary embodiments.

FIG. 16 is a view illustrating a semiconductor device according to some exemplary embodiments. For the sake of convenience, the following description will focus on differences that are not explained above with reference to FIGS. 1 to 15.

Referring to FIG. 16, the semiconductor device according to some exemplary embodiments may further include a third semiconductor chip 300.

Further, the second semiconductor chip 200 may include second through-silicon vias 220. The second through-silicon vias 220 may extend between the second surface 202 of the second semiconductor chip 200 and the first surface 201 of the second semiconductor chip.

As illustrated in FIG. 16, the second through-silicon vias 220 may not entirely penetrate the second semiconductor chip 200, but this is provided only for the sake of convenience and exemplary embodiments are not limited thereto.

Further, as illustrated in FIG. 16, there may be three (3) second through-silicon vias 220 formed within the second semiconductor chip 200, but this is provided only for the sake of convenience and exemplary embodiments are not limited thereto.

The second upper pads 222 may be formed on the second surface 202 of the second semiconductor chip 200. The second upper pads 222 may be connected with the second through-silicon vias 220. The second upper pads 222 may be through-via pads.

The third semiconductor chip 300 may be disposed on the second semiconductor chip 200. The third semiconductor chip 300 may overlie the second surface 202 of the second semiconductor chip 200, and may be connected with the second semiconductor chip 200.

The third semiconductor chip 300 may include a first surface 301 and a second surface 302 opposite each other. The third semiconductor chip 300 may include a third active region 305. The first surface 301 of the third semiconductor chip may face the second surface 202 of the second semiconductor chip 200.

The third active region 305 may be formed on the first surface 301 of the third semiconductor chip 300. The third active region 305 may be a region formed with a circuit pattern such as a transistor, a diode, and so on, and an interconnect structure to electrically connect the same.

Unlike the first semiconductor chip 100 and the second semiconductor chip 200, the third semiconductor chip 300 may not include a through-silicon via.

Third lower pads 321 may be formed on the first surface 301 of the third semiconductor chip 300. The third lower pads 321 may be connected with an interconnect structure included in the third active region 305.

Third connection terminals 325 may be connected with the third lower pads 321. The third connection terminals 325 may electrically connect the third semiconductor chip 300 with the second semiconductor chip 200.

The third connection terminals 325 are illustrated as solder balls having a ball shape, but exemplary embodiments are not limited thereto. Accordingly, the third connection terminals 325 may have the shape of a solder bump combining pillars with solder balls. When the third connection terminals 325 have a solder-bump shape, the third connection terminals 325 may be, for example, micro bumps.

The third semiconductor chip 300 may be, for example, a memory chip, a logic chip, and so on.

A second fixing film 230 may be formed between the second semiconductor chip 200 and the third semiconductor chip 300. The second fixing film 230 may be formed between the second surface 202 of the second semiconductor chip and the first surface 301 of the third semiconductor chip 300.

The second fixing film 230 may overlie at least a portion of a sidewall of the second semiconductor chip 200. An outer or edge portion of the second fixing film 230 may be formed along a perimeter of the third semiconductor chip 300.

The second fixing film 230 fills the space between the second semiconductor chip 200 and the third semiconductor chip 300, and surrounds the third connection terminals 325. The second fixing film 230 may include, for example, non-conductive film (NCF), or epoxy resin, or two or more types of silicone hybrid materials.

The first fixing film 130 and the second fixing film 230 on the second surface 102 of the first semiconductor chip 100 may include fixing materials or adhesive materials that surround the sidewall of the second semiconductor chip 200 and the sidewall of the third semiconductor chip 300. In some embodiments, the first fixing film 130 may surround at least a portion of the second semiconductor chip 200, but does not contact the sidewall of the third semiconductor chip 300.

The uneven pattern like the first uneven pattern 110 formed in the second surface 102 of the first semiconductor chip 100 may not be formed in the first surface 201 of the second semiconductor chip 200, the second surface 202 of the second semiconductor chip 200, and the first surface 301 of the third semiconductor chip 300.

That is, in a semiconductor device having a stack of two semiconductor chips 100, 200 including through-silicon vias, the uneven pattern may be formed on the first semiconductor chip 100 and not on the second semiconductor chip 200.

Additionally, as illustrated in FIG. 16, three (3) semiconductor chips may be stacked, but this is provided only for the sake of convenience and the embodiments are not limited thereto. Accordingly, three or more semiconductor chips including through-silicon vias may be stacked.

Figure 17:
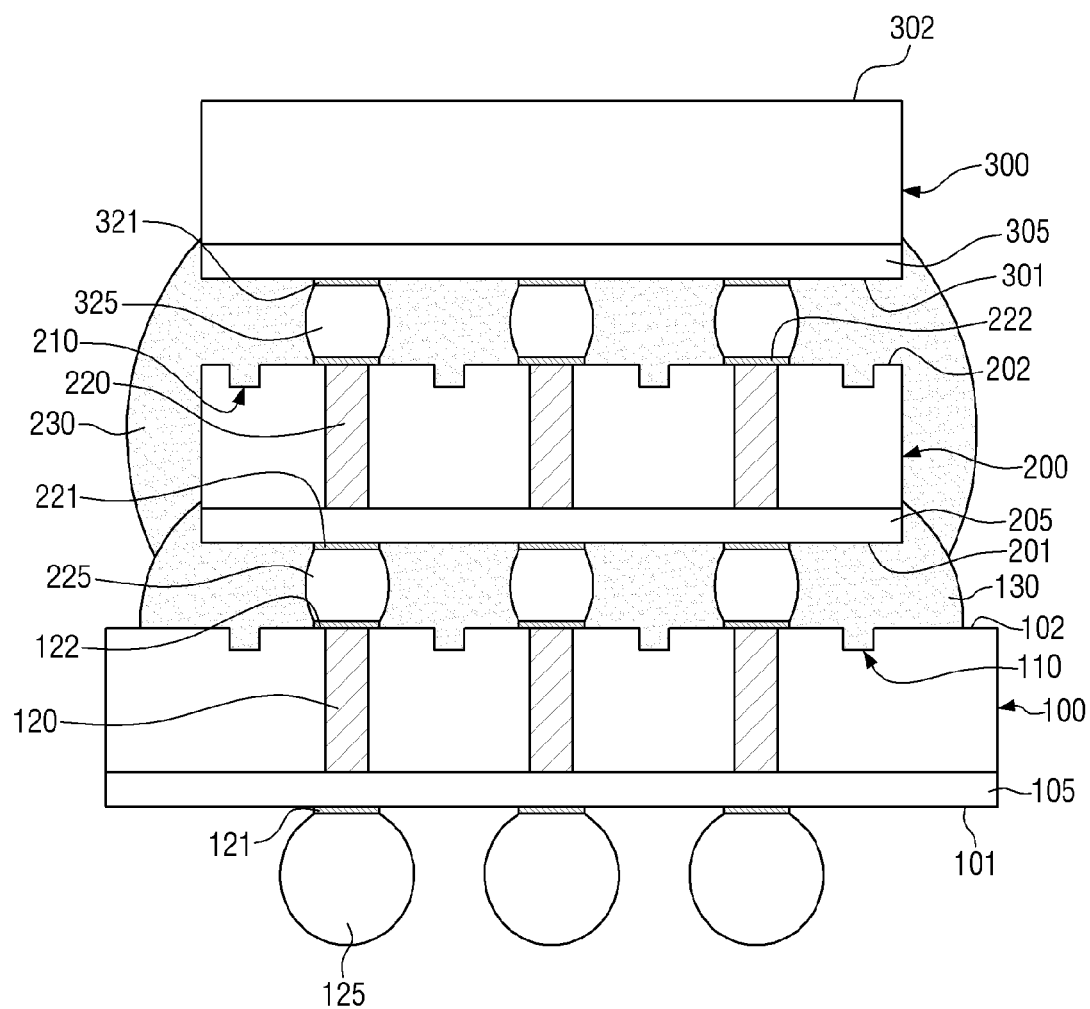
FIG. 17 is a view illustrating a semiconductor device according to some exemplary embodiments.
Figure 18:
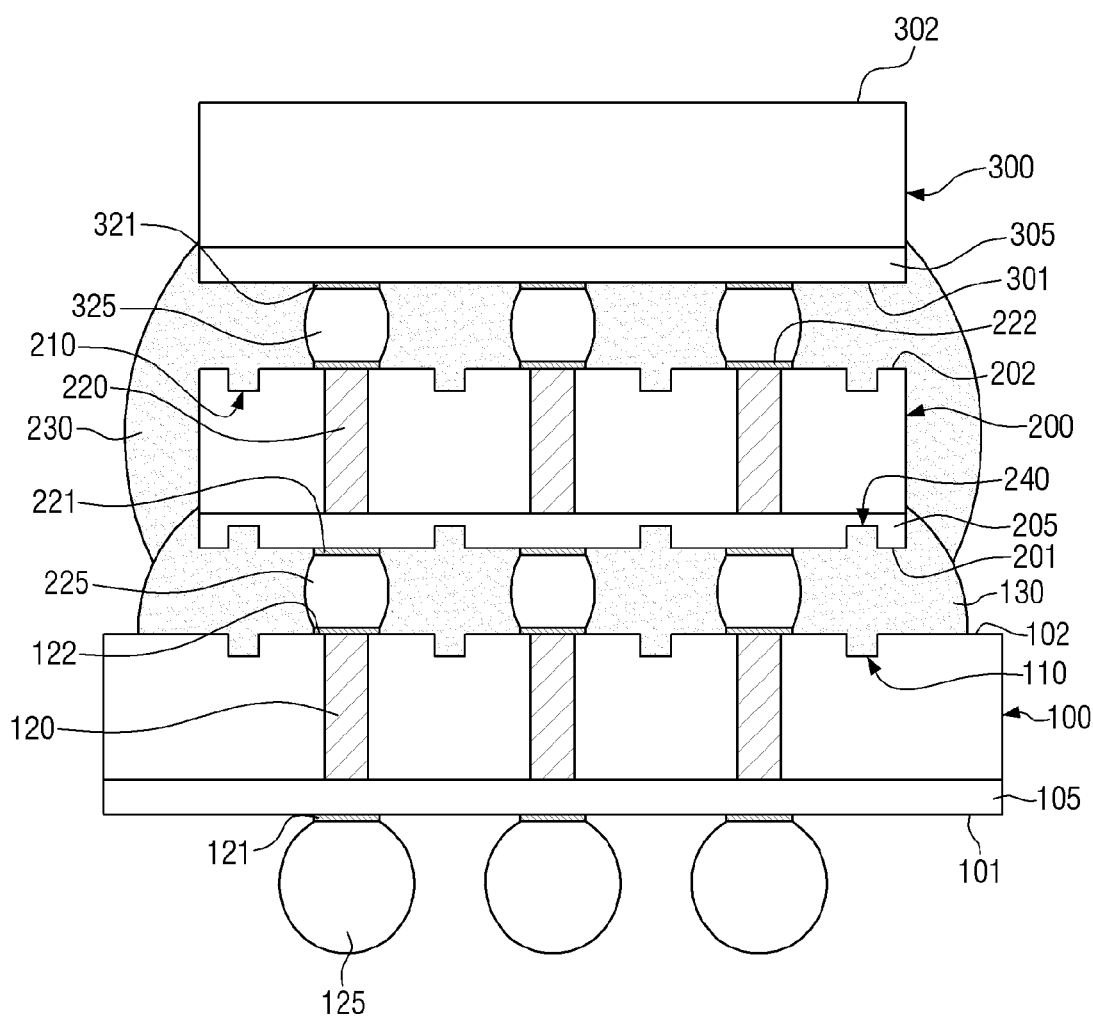
FIG. 18 is a view illustrating a semiconductor device according to some exemplary embodiments.

FIG. 17 is a view illustrating a semiconductor device according to some exemplary embodiments. FIG. 18 is a view illustrating a semiconductor device according to some exemplary embodiments. For the sake of convenience, the following description will focus on differences that are not explained above with reference to FIG. 16.

Referring to FIG. 17, the semiconductor device according to some exemplary embodiments may further include a second uneven pattern 210. The second uneven pattern 210 may be formed in the second surface 202 of the second semiconductor chip. The second uneven pattern 210 may include a negative pattern and/or a positive pattern formed on the second surface 202 of the second semiconductor chip 200. The third semiconductor chip 300 may overlap at least a portion of the second uneven pattern 210.

The second uneven pattern 210 will not be described below, as it may be similar to the description of the first uneven pattern 110 described with reference to FIGS. 1 to 15.

In some embodiments, in contrast with the embodiment illustrated in FIG. 17, the first uneven pattern 110 may not be formed in the second surface 102 of the first semiconductor chip, and the second uneven pattern 210 may be formed only in the second surface 202 of the second semiconductor chip.

Referring to FIG. 18, the semiconductor device according to some exemplary embodiments may further include a second uneven pattern (or a second flow regulating structure) 210 and a third uneven pattern (or a third flow regulating structure) 240.

The second uneven pattern 210 may be formed in the second surface 202 of the second semiconductor chip 200. The third uneven pattern 240 may be formed in the first surface 201 of the second semiconductor chip 200. That is, the uneven pattern may be formed at both the first surface 201 and the second surface 202 of the second semiconductor chip 200.

The second uneven pattern 210 may include a negative pattern and/or a positive pattern formed on the second surface 202 of the second semiconductor chip 200. The third semiconductor chip 300 may overlap at least a portion of the second uneven pattern 210 in a vertical direction.

The third uneven pattern 240 may include a negative pattern and/or a positive pattern formed on the first surface 201 of the second semiconductor chip.

The second uneven pattern 210 and the third uneven pattern 240 will not be described below, as it may be similar to the description of the first uneven pattern 110 described with reference to FIGS. 1 to 15.

In contrast with the embodiment illustrated in some embodiments, in FIG. 18, the uneven pattern may also be formed on the first surface 301 of the third semiconductor chip. Further, the first uneven pattern 110 may not be formed on the second surface 102 of the first semiconductor chip.

Figure 19A:
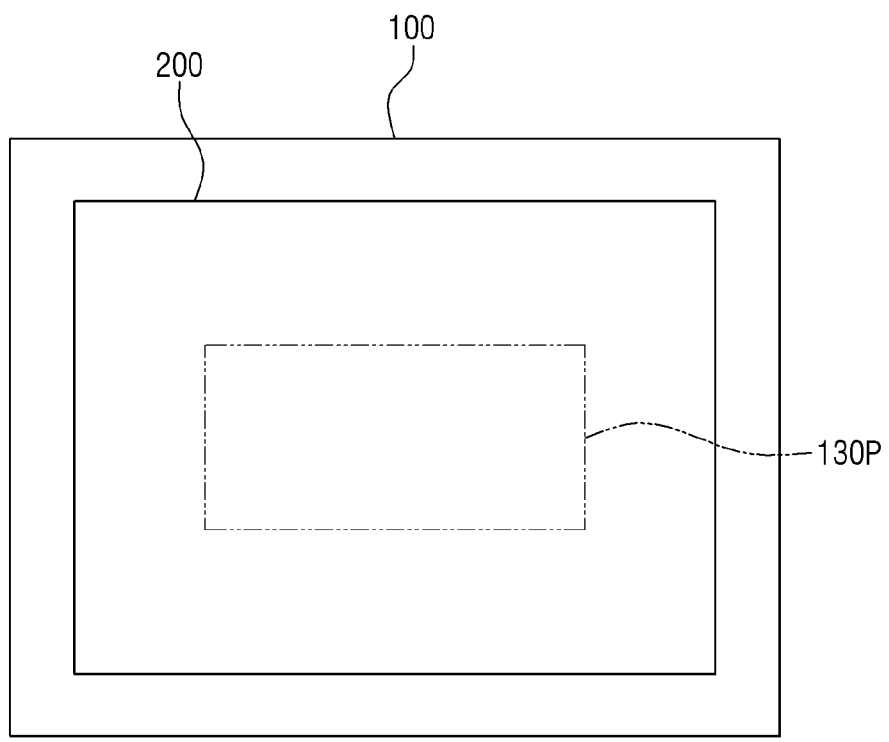
FIGS. 19A to 20 are views illustrating an operation of fixing a semiconductor chip during a process of fabricating a semiconductor device according to some exemplary embodiments.
Figure 19B:
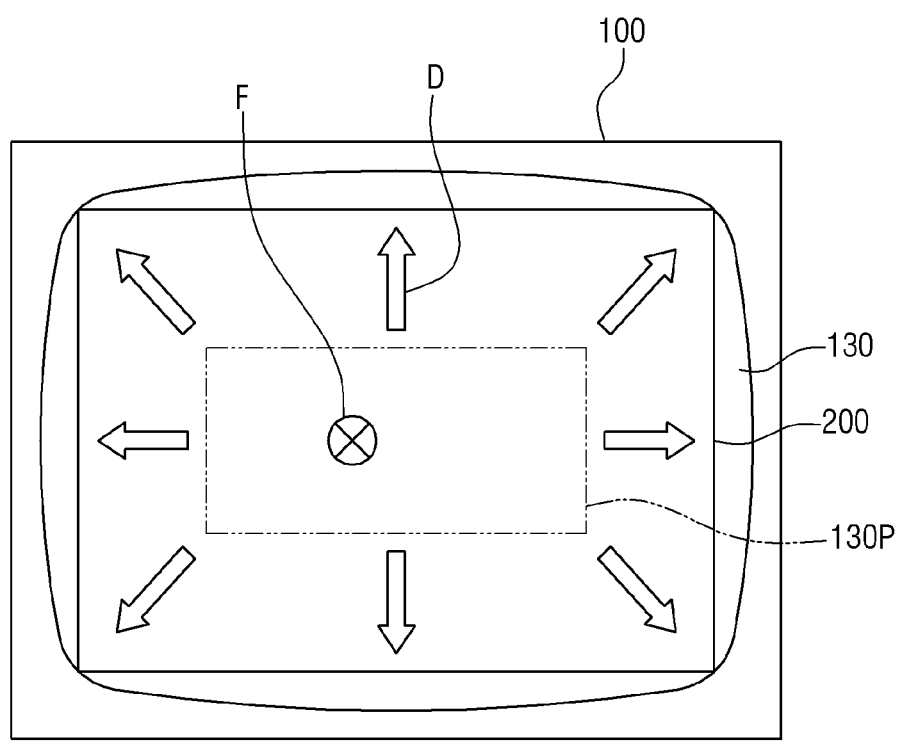
Figure 20:
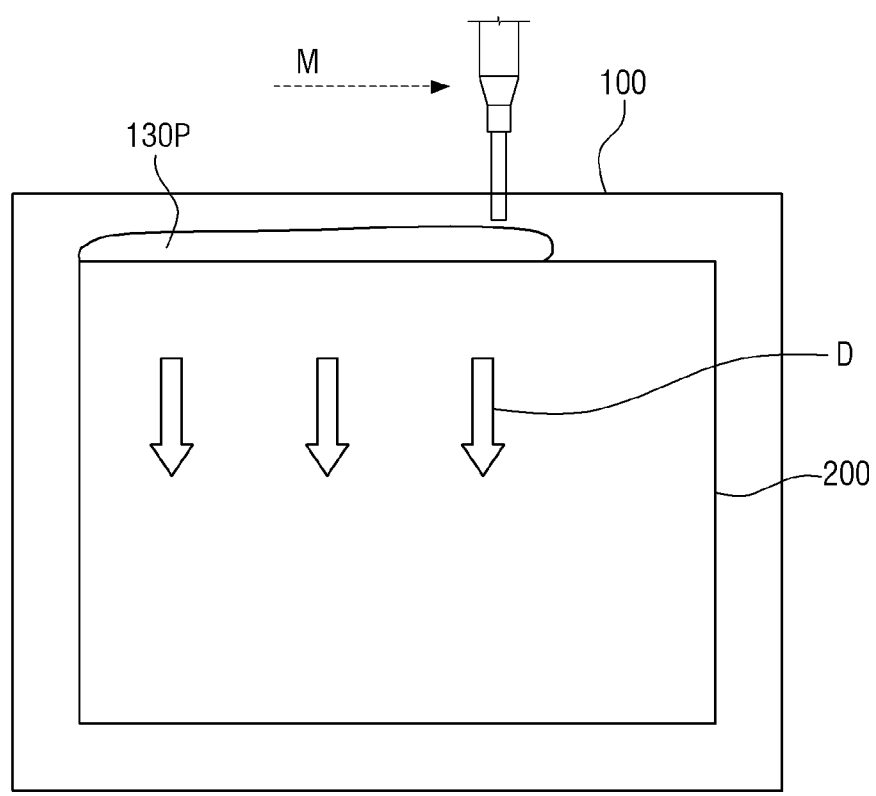

FIGS. 19A to 20 are top plan views of stacked semiconductor chips illustrating a process of fixing the stacked semiconductor chips to each other during a process of fabricating a semiconductor device or package according to some exemplary embodiments.

In particular, FIGS. 19A and 19B illustrate an example in which a semiconductor chip is fixed by using an adhesive film, i.e., a fixing film, and FIG. 20 illustrates an example in which a semiconductor chip is fixed by using an underfill material, and so on.

Further, while FIGS. 19A to 20 illustrate an example in which one semiconductor chip is fixed to another semiconductor chip, this is provided only for the sake of convenience and exemplary embodiments are not limited thereto. That is, FIGS. 19A and 19B may illustrate only some of examples in which a second semiconductor chip is fixed to a substrate including a first semiconductor chip. Further, FIG. 20 may illustrate an example in which a plurality of second semiconductor chips are connected onto the first semiconductor chip and then fixed.

Referring to FIG. 19A, the second semiconductor chip 200 including a pre-fixing film 130P is positioned on the first semiconductor chip 100.

Next, referring to FIG. 19B, the first fixing film 130 may be formed between the first semiconductor chip 100 and the second semiconductor chip 200 by exerting force F in a downward direction (i.e., the direction illustrated as passing through the paper).

In this situation, the direction D in which the pre-fixing film 130P is moved by the force F exerted onto the second semiconductor chip 200 may be radial. That is, the pre-fixing film 130P between the first semiconductor chip 100 and the second semiconductor chip 200 may be moved in all directions and become the first fixing film 130 that fixes the first semiconductor chip 100 and the second semiconductor chip 200.

In this case, since the direction D in which the pre-fixing film 130P is moved is radial, the first uneven pattern 110 (in FIG. 2A) formed on the first semiconductor chip 100, may be formed symmetrically. Because the first uneven pattern is formed symmetrically, it is possible to control the movement of the pre-fixing film 130P to be uniform.

Alternatively, referring to FIG. 20, the direction D in which the pre-fixing film 130P is moved to fix the first semiconductor chip 100 and the second semiconductor chip 200 may be one direction.

When the pre-fixing film 130P such as the underfill material is provided in a first direction M, the pre-fixing film 130P may flow in only one direction, and the fixing film 130 may thus be formed between the first semiconductor chip 100 and the second semiconductor chip 200.

In this case, the first uneven pattern may be formed asymmetrically to prevent the pre-fixing film 130P from moving excessively in one direction or from not moving at all.

Figure 21:
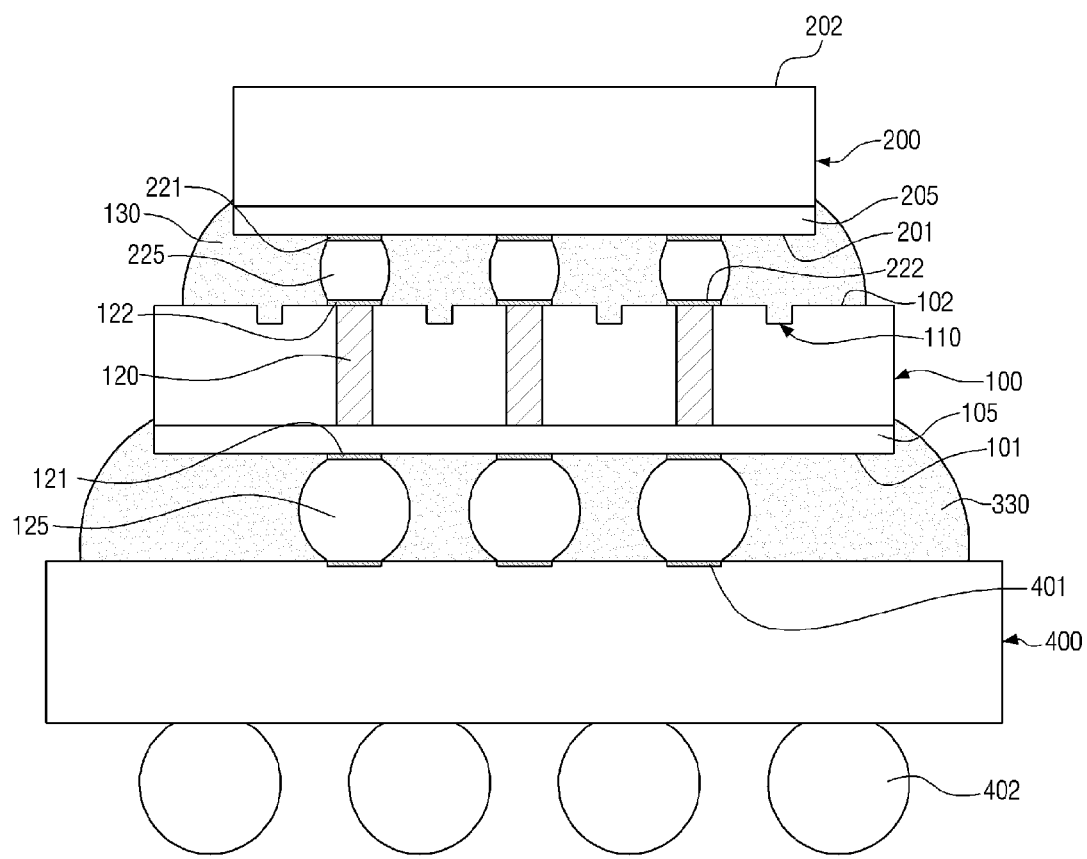
FIG. 21 is an exemplary view of a semiconductor device mounted to a base substrate according to some exemplary embodiments.

FIG. 21 is an exemplary view of a semiconductor device mounted to a base substrate according to some exemplary embodiments. Referring to FIG. 21, the first semiconductor chip 100 and the second semiconductor chip 200 may be stacked on a first base substrate 400 in a sequential order.

The first base substrate 400 may be a package substrate, and may be, for example, printed circuit board (PCB), ceramic substrate, and so on. The first connection terminals 125 may be connected with bonding pads 401 formed on the first base substrate 400.

The bonding pads 401 may be electrically connected to an external terminal that is connected to an external device, and may supply an electric signal to the first semiconductor chip 100 and the second semiconductor chip 200. Alternatively, at least one of the bonding pads 401 may be a ground pad, for example, and may be electrically connected to a ground line within the first base substrate 400.

Fourth connection terminals 402 may be connected with the first base substrate 400. Further, a third fixing film 330 may be formed between the first semiconductor chip 100 and the first base substrate 400, and may surround the first connection terminals 125.

Figure 22:
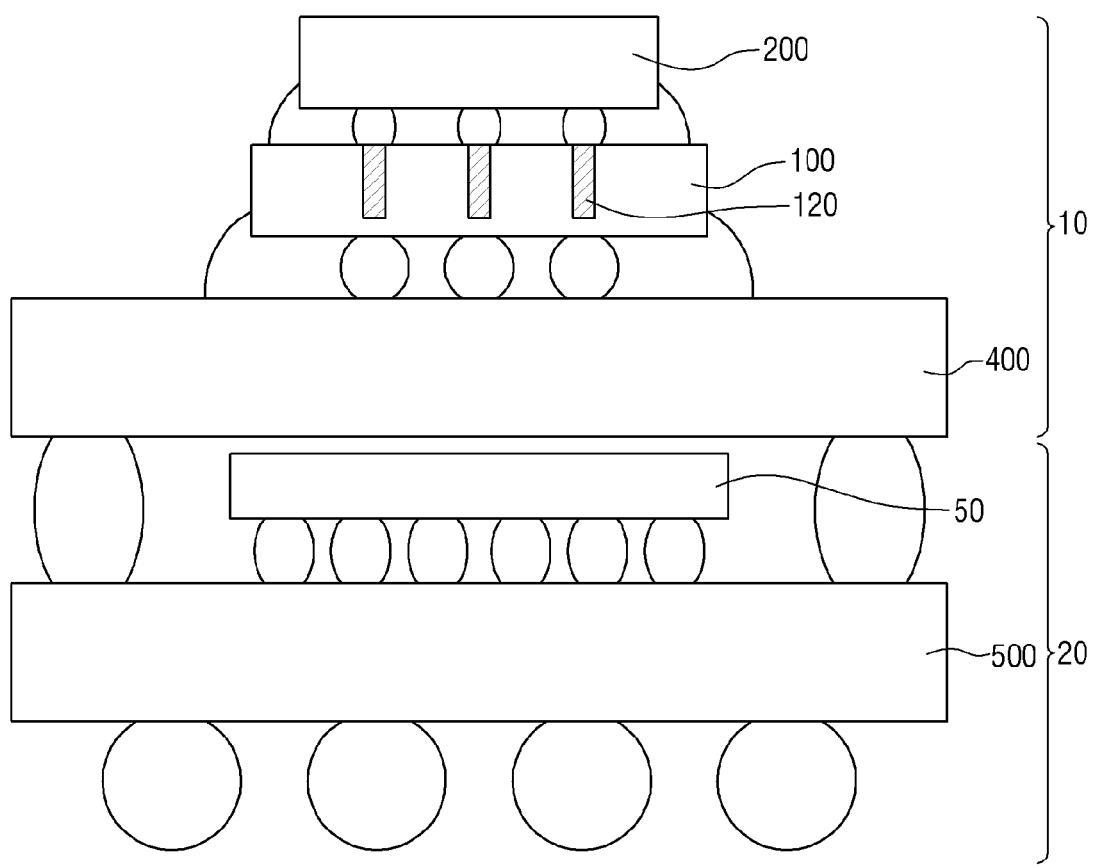
FIG. 22 is an exemplary view of a package on package (POP) comprising a semiconductor device according to some exemplary embodiments.

FIG. 22 is an exemplary view of a package on package (POP) comprising a semiconductor device according to some exemplary embodiments.

An upper semiconductor package 10 may include the first semiconductor chip 100 including the first through-silicon vias 120, and the second semiconductor chip 200 connected with the first semiconductor chip 100.

Further, the upper semiconductor package 10 may include the first base substrate 400 connected with the first semiconductor chip 100.

A lower semiconductor package 20 may include a second base substrate 500, and a fourth semiconductor chip 50 connected with the second base substrate 500.

The upper semiconductor package 10 and the lower semiconductor package 20 may be electrically connected by conductive bumps, for example.

As illustrated in FIG. 22, the upper semiconductor package 10 may include two semiconductor chips, and the lower semiconductor package 20 may include one semiconductor chip, but this is provided only for the sake of convenience and exemplary embodiments are not limited thereto.

Further, unlike the illustration in FIG. 22, the first semiconductor chip 100 including the first through-silicon vias 120 and the second semiconductor chip 200 connected with the first semiconductor chip 100 may be included in the lower semiconductor package 20 rather than the upper semiconductor package 10.

Figure 23:
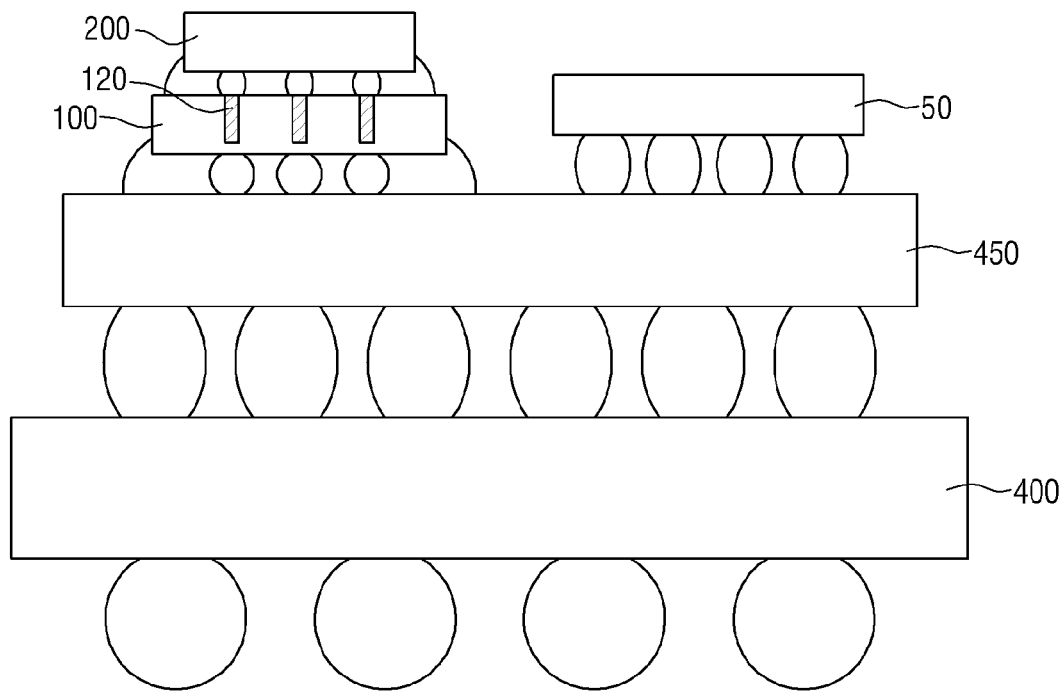
FIG. 23 is an exemplary view of a semiconductor package comprising a semiconductor device according to some exemplary embodiments.

FIG. 23 is an exemplary view of a semiconductor package comprising a semiconductor device according to some exemplary embodiments.

Referring to FIG. 23, the first semiconductor chip 100 including the first through-silicon vias 120, and the second semiconductor chip 200 connected with the first semiconductor chip 100 may be mounted on an interposer substrate 450.

Further, the fourth semiconductor chip 50 may also be mounted on the interposer substrate 450. The first semiconductor chip 100 may be electrically connected with the fourth semiconductor chip 50 through the interposer substrate 450.

The interposer substrate 450 with the first semiconductor chip 100, the second semiconductor chip 200, and the fourth semiconductor chip 50 mounted thereto may be connected with the first base substrate 400.

Figure 24:
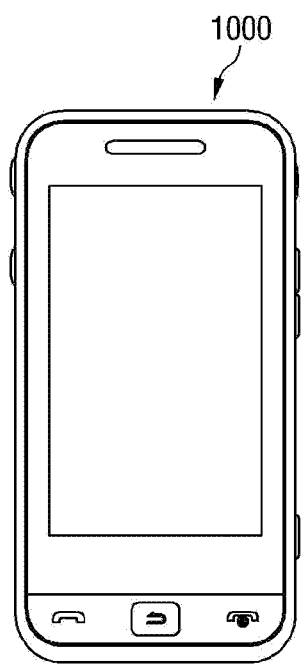
FIG. 24 is a perspective view of an electronic apparatus provided with a semiconductor package comprising a semiconductor device according to some exemplary embodiments.

FIG. 24 is a perspective view of an electronic apparatus provided with a semiconductor package comprising a semiconductor device according to some exemplary embodiments.

Figure 8B:
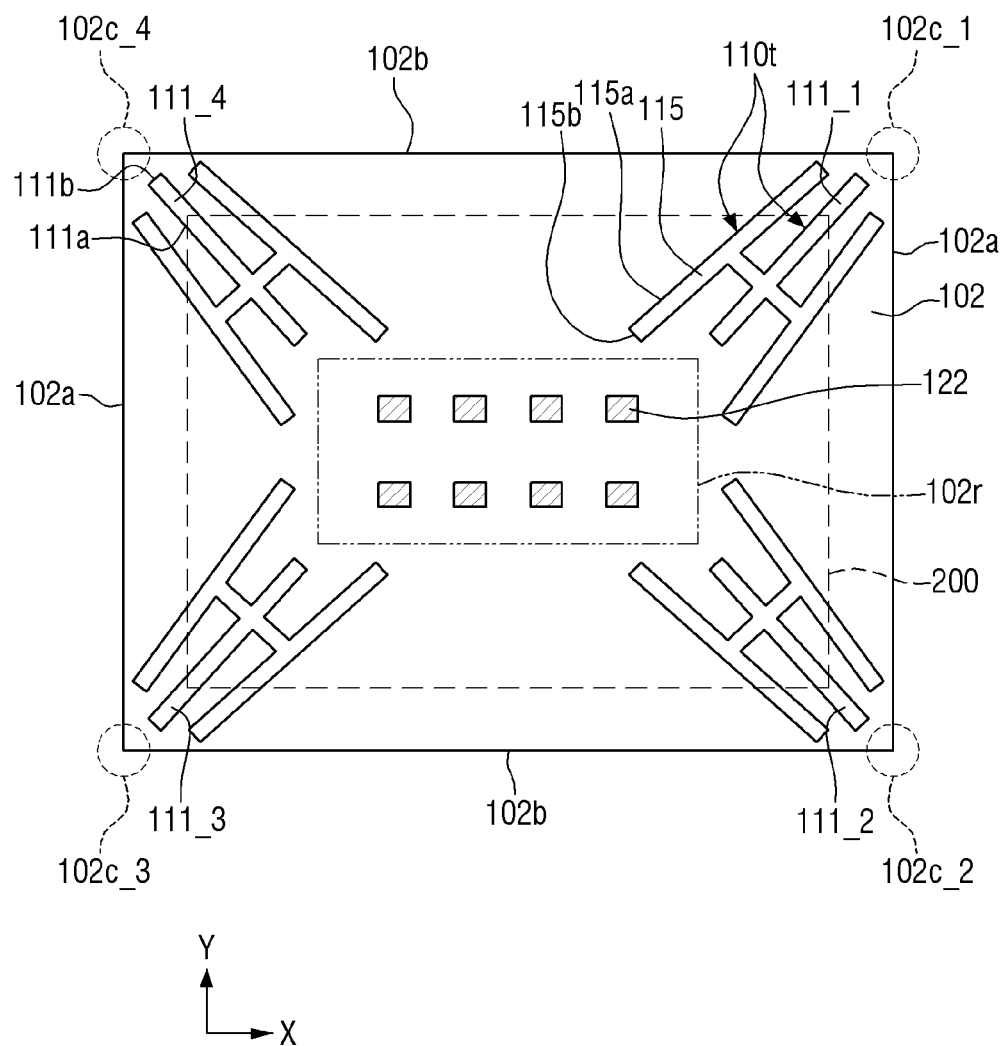
FIG. 8B is a plan view illustrating a semiconductor device according to some exemplary embodiments.

The uneven patterns or the flow regulating structure discussed above have been described as having a straight line trench or protruding structure. However, the present inventive concepts can also applied using other structures within the spirit and scope of the present disclosure. For example, the trench can have a wavy form as shown in FIG. 2B when viewed in plan view as opposed to straight-line shape as shown in FIG. 2A. Also, the uneven pattern or flow regulating structure can have multiple trenches having interconnecting trenches formed near the ends or middle portions thereof as illustrated in FIG. 8B.

Referring to FIG. 24, a semiconductor package including a semiconductor device according to some exemplary embodiments may be applied for use in an electronic apparatus 1000 such as a mobile phone. The semiconductor package including a semiconductor device provides superior reliability, and therefore, the semiconductor package can guarantee operation reliability even when the electronic apparatus 1000 is used under severe condition. The electronic apparatus is not limited to the mobile phone illustrated in FIG. 24, but may include, for example, a mobile electronic device, a laptop computer, a portable multimedia player (PMP), an MP3 player, a camcorder, a memory stick, a memory card, and a variety of electronic devices.

In concluding the detailed description, those skilled in the art will appreciate that many variations and modifications can be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor device, comprising:
a first semiconductor chip including a first surface and a second surface opposite to each other;
a first uneven pattern formed at the first surface of the first semiconductor chip; and
a second semiconductor chip mounted on the first surface of the first semiconductor chip,
wherein the second semiconductor chip overlaps at least a portion of the first uneven pattern in a vertical direction,
the first surface of the first semiconductor chip includes a first corner and a second corner,
the first uneven pattern includes a trench structure formed within the first semiconductor chip,
the trench structure includes a first radial trench, and
the first radial trench is formed radially in the first surface of the first semiconductor chip, the first radial trench extending toward the first corner, and
wherein the first uneven pattern includes a protruding structure protruding from the first surface of the first semiconductor chip and protruding away from the second surface of the first semiconductor chip.

2. The semiconductor device of claim 1,
wherein the first surface of the first semiconductor chip further includes a side connecting the first corner and the second corner,
the trench structure further includes a second radial trench and a parallel trench,
the second radial trench is formed radially in the first surface of the first semiconductor chip, the second radial trench extending toward the second corner, and
the parallel trench extends between the first and second radial trenches, along the side of the first surface of the first semiconductor chip.

3. The semiconductor device of claim 2,
wherein the first and second radial trenches and the parallel trench are connected with each other.

4. The semiconductor device of claim 2,
wherein the parallel trench includes a long sidewall and a short sidewall, and
the long sidewall of the parallel trench extends along the side of the first surface of the first semiconductor chip.

5. The semiconductor device of claim 2,
wherein each of the first and second radial trench extends from a center region of the first surface of the first semiconductor chip toward the first and second corners of the first surface of the first semiconductor chip, and
a distance between the first and second radial trench increases as a distance from the first and second corners increases.

6. The semiconductor device of claim 1,
wherein the first surface of the first semiconductor chip includes a first side and a second side that are connected,
the trench structure includes a first trench formed along the first side, and a second trench formed along the second side,
each of the first trench and the second trench includes a long sidewall and a short sidewall, and
the long sidewall of the first trench extends along the first side, and the long sidewall of the second trench extends along the second side.

7. The semiconductor device of claim 1,
wherein the first surface of the first semiconductor chip includes a first side connected to a second side,
the protruding structure includes a first protruding pattern extending along the first side, and a second protruding pattern extending along the second side,
each of the first protruding pattern and the second protruding pattern includes a long sidewall and a short sidewall, and the long sidewall of the first protruding pattern extends along the first side, and the long sidewall of the second protruding pattern extends along the second side.

8. The semiconductor device of claim 7, wherein the first protruding pattern and the second protruding pattern are not connected with each other.

9. The semiconductor device of claim 1, wherein the first semiconductor chip comprises a through-silicon via (TSV).

10. The semiconductor device of claim 1, further comprising a second radial trench is formed radially in the first surface of the first semiconductor chip,
wherein the second radial trench extending toward a second corner of the first surface of the first semiconductor chip, and
the first radial trench and the second radial trench are separated from each other.

11. A semiconductor device, comprising:
a first semiconductor chip including a through-silicon via;
a connection terminal attached to a second surface opposite a first surface of the first semiconductor chip;
a second semiconductor chip mounted on the first surface of the first semiconductor chip;
a fixing film formed on the first surface of the first semiconductor chip and extending between the first semiconductor chip and the second semiconductor chip; and
a first radial trench and a second radial trench formed in the first surface of the first semiconductor chip, the first radial trench and the second radial trench extending from a center region of the first surface of the first semiconductor chip toward a first corner and a second corner of the first surface of the first semiconductor chip, respectively,
wherein the first radial trench and the second radial trench are separated from each other at the center region of the first surface.

12. The semiconductor device of claim 11, wherein the second semiconductor chip overlaps at least a portion of the first and second radial trenches in a vertical direction.

13. The semiconductor device of claim 11, wherein the first surface of the first semiconductor chip includes a first side and a second side that are connected,
the semiconductor device further comprises a first parallel trench formed along the first side, and a second parallel trench formed along the second side,
each of the first parallel trench and the second parallel trench includes a long sidewall and a short sidewall, and
the long sidewall of the first parallel trench extends along the first side, and the long sidewall of the second parallel trench extends along the second side.

14. The semiconductor device of claim 11, wherein the first surface of the first semiconductor chip includes a first side and a second side that are connected,
the semiconductor device further comprises a first protruding pattern extending along the first side, and a second protruding pattern extending along the second side,
each of the first protruding pattern and the second protruding pattern includes a long sidewall and a short sidewall,
the long sidewall of the first protruding pattern extends along the first side, and the long sidewall of the second protruding pattern extends along the second side, and
the first protruding pattern and the second protruding pattern each protrudes from the first surface of the first semiconductor chip and protrudes away from the second surface of the first semiconductor chip.

* * * * *